(12) United States Patent
Suda et al.

(10) Patent No.: US 10,897,098 B2
(45) Date of Patent: Jan. 19, 2021

(54) CONNECTOR AND CONNECTOR ASSEMBLY

(71) Applicant: Japan Aviation Electronics Industry, Limited, Tokyo (JP)

(72) Inventors: Yuki Suda, Tokyo (JP); Yukitaka Tanaka, Tokyo (JP)

(73) Assignee: Japan Aviation Electronics Industry, Limited, Tokyo (JP)

( * ) Notice: Subject to any disclaimer, the term of this patent is extended or adjusted under 35 U.S.C. 154(b) by 0 days.

(21) Appl. No.: 16/527,456

(22) Filed: Jul. 31, 2019

(65) Prior Publication Data

US 2020/0144751 A1    May 7, 2020

(30) Foreign Application Priority Data

Nov. 1, 2018 (JP) ................. 2018-206309

(51) Int. Cl.
*H01R 12/77* (2011.01)
*H05K 1/11* (2006.01)

(52) U.S. Cl.
CPC ......... *H01R 12/775* (2013.01); *H01R 12/774* (2013.01); *H01R 12/778* (2013.01); *H05K 1/118* (2013.01)

(58) Field of Classification Search
CPC .................................................. H01R 12/775
See application file for complete search history.

(56) References Cited

U.S. PATENT DOCUMENTS

| | | |
|---|---|---|
| 6,315,616 B1 | 11/2001 | Hayashi |
| 8,167,631 B2 | 5/2012 | Ito et al. |
| 8,585,433 B2 | 11/2013 | Honda |
| 8,845,360 B2 | 9/2014 | Ohyama |
| 9,166,320 B1 * | 10/2015 | Herring ............. H01R 13/6592 |
| 9,368,892 B2 | 6/2016 | Kondo et al. |
| 10,096,944 B2 | 10/2018 | Huang et al. |
| 10,135,161 B2 * | 11/2018 | Sunada ............. H01R 13/6275 |

(Continued)

FOREIGN PATENT DOCUMENTS

| | | |
|---|---|---|
| CN | 102195214 A | 9/2011 |
| CN | 105024231 A | 11/2015 |

(Continued)

OTHER PUBLICATIONS

Office Action in Korean Patent Application No. 10-2019-0109533 dated Nov. 30, 2020.

*Primary Examiner* — Ross N Gushi

(74) *Attorney, Agent, or Firm* — Collard & Roe, P.C.

(57) ABSTRACT

A plug as a connector includes a first wiring board, a second wiring board, a plate-shaped ground plate which is provided between the first and the second wiring boards and which includes a first contact point to be brought into contact with first and second ground conductors of the first and the second wiring boards, and a first insulator for holding the first and the second wiring boards, and the ground plate. The first insulator covers at least a part of each of five portions including distal end portions, both side end portions, and two main surface portions, which face outward, of a whole of the first wiring board, the second wiring board, and the ground plate, and holds the ground plate under a pressing state. A portion of at least one side end portion of the ground plate is exposed to the outside of the first insulator.

12 Claims, 17 Drawing Sheets

(56) References Cited

U.S. PATENT DOCUMENTS

| | | |
|---|---|---|
| 10,135,197 B2 | 11/2018 | Little et al. |
| 10,431,935 B2 | 10/2019 | Huang et al. |
| 2006/0042816 A1 | 3/2006 | Sakurai et al. |
| 2007/0141897 A1 | 6/2007 | Miura et al. |
| 2009/0298327 A1* | 12/2009 | Wang .................. H01R 12/777 |
| | | 439/507 |
| 2011/0189895 A1 | 8/2011 | Ito et al. |
| 2013/0012056 A1 | 1/2013 | Ohyama |
| 2013/0052858 A1* | 2/2013 | Honda .................. H01R 12/79 |
| | | 439/374 |
| 2015/0311614 A1 | 10/2015 | Kondo et al. |
| 2018/0090887 A1 | 3/2018 | Little et al. |
| 2018/0212364 A1 | 7/2018 | Huang et al. |
| 2019/0006794 A1 | 1/2019 | Huang et al. |
| 2019/0173232 A1* | 6/2019 | Lu ....................... H01R 12/716 |
| 2019/0296495 A1* | 9/2019 | Zhou .................... H01R 13/631 |
| 2020/0076126 A1* | 3/2020 | Yang .................... H01R 12/79 |
| 2020/0212612 A1* | 7/2020 | Yang ................. H01R 13/6585 |

FOREIGN PATENT DOCUMENTS

| | | |
|---|---|---|
| CN | 102804510 B | 5/2016 |
| CN | 107871987 A | 4/2018 |
| JP | 2006-073367 A | 3/2006 |
| JP | 2013-51111 A | 3/2013 |
| JP | 2015-222638 A | 12/2015 |
| KR | 1999-00662007 A | 8/1999 |
| TW | I482371 B | 4/2015 |
| TW | M551363 U | 11/2017 |
| WO | 2018/193836 A1 | 10/2018 |

* cited by examiner

CONNECTOR AND CONNECTOR ASSEMBLY

CROSS REFERENCE TO RELATED APPLICATIONS

Applicant claims priority under 35 U.S.C. § 119 of Japanese Application No. 2018-206309 filed on Nov. 1, 2018, the disclosure of which is incorporated by reference.

BACKGROUND OF THE INVENTION

1. Field of the Invention

This invention relates to a connector and a connector assembly.

2. Description of the Related Art

In Japanese Unexamined Patent Application Publication (JP-A) No. 2013-51111, as illustrated in FIG. 21, there is disclosed a connector set (hereinafter also referred to as "connector assembly") including a receptacle 20 and a plug (connector) 30. In the plug 30 described in Japanese Unexamined Patent Application Publication (JP-A) No. 2013-51111, a flexible flat cable (FFC) or a flexible printed circuit (FPC) is used as a connection member 10.

According to Japanese Unexamined Patent Publication (JP-A) No. 2013-51111, as illustrated in FIG. 22, the connection member 10 includes a flat plate-shaped first portion 11 extending in a first direction (fitting direction) A1 to be connected to a connection counterpart, and a flat plate-shaped second portion 12 extending in a second direction A2 orthogonal to the first direction A1. On an outer surface of the first portion 11, a large number of signal conductors (hereinafter also referred to as "signal wirings") 15 of the connection member 10 are exposed to the outside. Further, the second portion 12 includes a ground conductor 18 on an inner side surface thereof.

The plug 30 described in Japanese Unexamined Patent Application Publication (JP-A) No. 2013-51111 includes the connection member 10 described above, a base 31 and a cover 32, which cooperate with each other to sandwich the connection member 10 from both surface sides. The base 31 includes a conductive base ground 37 on a surface opposite to a surface on which the connection member 10 is provided. Further, the base ground 37 includes a spring 54 passing through the base 31, and is brought into contact with the ground conductor 18 of the connection member 10 through intermediation of the spring 54.

The receptacle 20 described in Japanese Unexamined Patent Application Publication (JP-A) No. 2013-51111 includes, as illustrated in FIG. 21, a large number of conductive signal contacts 23 assembled to a receptacle housing 22, and one or a plurality of conductive ground contacts 24. When the plug 30 is connected to the receptacle 20, the contact point portions formed by the signal wirings 15 are brought into contact with signal contact points 26 of the signal contacts 23, and the base ground 37 is brought into contact with a ground connection 27 of the receptacle 20.

In recent years, in order to transmit more information at higher speed, the connector 30 and the connector assembly to which a larger number of signal wirings can be connected have been expected. However, when a plurality of connectors 30 described in Japanese Unexamined Patent Application Publication (JP-A) No. 2013-51111 are used, a volume of the connectors 30 or the connector assembly occupied in a product including the connectors 30 or the connector assembly becomes larger, and hence there is a fear in that the product may be increased in size, or limited in design.

Further, in the connector 30, an increase of a number of signal wirings in an arrangement direction thereof and an arrangement of a plurality of sets of the connecting members 10 and the base ground 37 may be considered, for example. On this occasion, even when the number of connectors 30 is one, the connector 30 itself increases in size in association with the number of increased signal wirings and the number of sets of the connecting members 10 and the base ground 37. Therefore, in the product including the connector 30 or the connector assembly, the volume occupied by the connector 30 or the connector assembly is increased. As a result, as in the case of using a plurality of connectors 30, there is a fear in that the product may be increased in size, or limited in design.

SUMMARY OF THE INVENTION

This invention has been made in view of such circumstances, and it is therefore an object of this invention to provide a compact connector and connector assembly to which a large number of wirings can be connected.

In order to achieve the above-mentioned object, a connector according to a first aspect of this invention comprises:

a first flexible wiring board including a first signal wiring and a first ground conductor;

a second flexible wiring board including a second signal wiring and a second ground conductor;

a plate-shaped ground plate, which is provided between the first flexible wiring board and the second flexible wiring board, and includes a first contact point, which is brought into contact with each of the first ground conductor and the second ground conductor; and a first insulator forming an accommodation space for holding the first flexible wiring board, the second flexible wiring board, and the ground plate, wherein the first insulator forms the accommodation space so as to cover at least a part of each of five portions including distal end portions, both side end portions, and two main surface portions, which face outward, of a whole of the first flexible wiring board, the second flexible wiring board, and the ground plate, and holds the ground plate under a pressing state, wherein a portion of each of the first signal wiring and the second signal wiring is exposed to an outside of the first insulator, and wherein a portion of at least one side end portion of the ground plate is exposed to the outside of the first insulator.

The first insulator may include a main body portion configured to hold the ground plate under a pressing state; and a protecting portion having a width narrower than a width of the main body portion so as to expose the portion of the at least one side end portion of the ground plate to the outside.

The protecting portion may include a plate holding groove, into which a protected portion including the distal end portion of the ground plate is to be fitted inside; and a distal end protecting portion configured to block at least a part of the plate holding groove and the outside of the first insulator.

The distal end protecting portion may include a through hole for connecting the plate holding groove and the outside of the first insulator.

The ground plate may further include a first elastic portion configured to apply, by having elasticity, a force toward one of the first ground conductor and the second ground conductor to be brought into contact with a first contact point, to the first contact point.

The ground plate may further include a flat plate-shaped main plate portion. The first elastic portion may include a base end portion, which is connected to the main plate portion to be bent or curved, and a plate-shaped portion extending from the base end portion to be connected to the first contact point. And, the first contact point may be positioned closer to the distal end portion of the ground plate than the base end portion.

The first flexible wiring board, the second flexible wiring board, the ground plate, and the first insulator may include a first locking portion, a second locking portion, a third locking portion, and a fitting retainer portion, respectively, which are aligned in one direction to form a space when the first flexible wiring board, the second flexible wiring board, and the ground plate are held in the first insulator. And, the connector further includes a retainer member, which is fixed to the fitting retainer portion and penetrates the first locking portion, the second locking portion, and the third locking portion, which are aligned in the one direction.

The first flexible wiring board may further include a third ground conductor provided in a direction different from the first ground conductor across the first signal wiring. And, the second flexible wiring board further may include a fourth ground conductor provided in a direction different from the second ground conductor across the second signal wiring.

In order to achieve the above-mentioned object, a connector assembly according to a second aspect of this invention comprises:

the above-mentioned connector; and
a mating connector to be fitted to the connector;
the mating connector including:
 a first contact to be brought into contact with the first signal wiring;
 a second contact to be brought into contact with the second signal wiring;
 a ground metal fitting to be brought into contact with a portion of the at least one side end portion of the ground plate exposed to the outside of the first insulator of the ground plate; and
 a second insulator configured to hold the first contact and the second contact.

The ground metal fitting may include a second contact point to be brought into contact with a portion of the at least one side end portion of the ground plate; and a second elastic portion configured to apply, by having elasticity, a force toward the portion of the at least one side end portion of the ground plate to the second contact point.

The mating connector further may include a metal shell provided in a vicinity of the second insulator. The metal shell may include a flat plate-shaped shell side surface portion provided in correspondence to the side surface of the second insulator. The ground metal fitting may include a plate spring contact. And, the shell side surface portion may include a shell opening portion, to which one end of the ground metal fitting is to be fixed.

Portions of both side end portions of the ground plate may be exposed to the outside of the first insulator. The ground metal fitting may be provided in a pair on each side of the portions of both of the exposed side end portions of the ground plate. And, the pair of ground metal fittings may be configured to sandwich, from sides, the portions of both of the exposed side end portions of the ground plate to be brought into contact with the portions.

According to this invention, a large number of wirings can be connected by a compact connector or a compact connector assembly.

DESCRIPTION OF THE EMBODIMENTS

A connector and a connector assembly according to an embodiment of this invention are described with reference to the drawings. The same components are denoted by the same reference symbols in all of the drawings.

Figure 1:
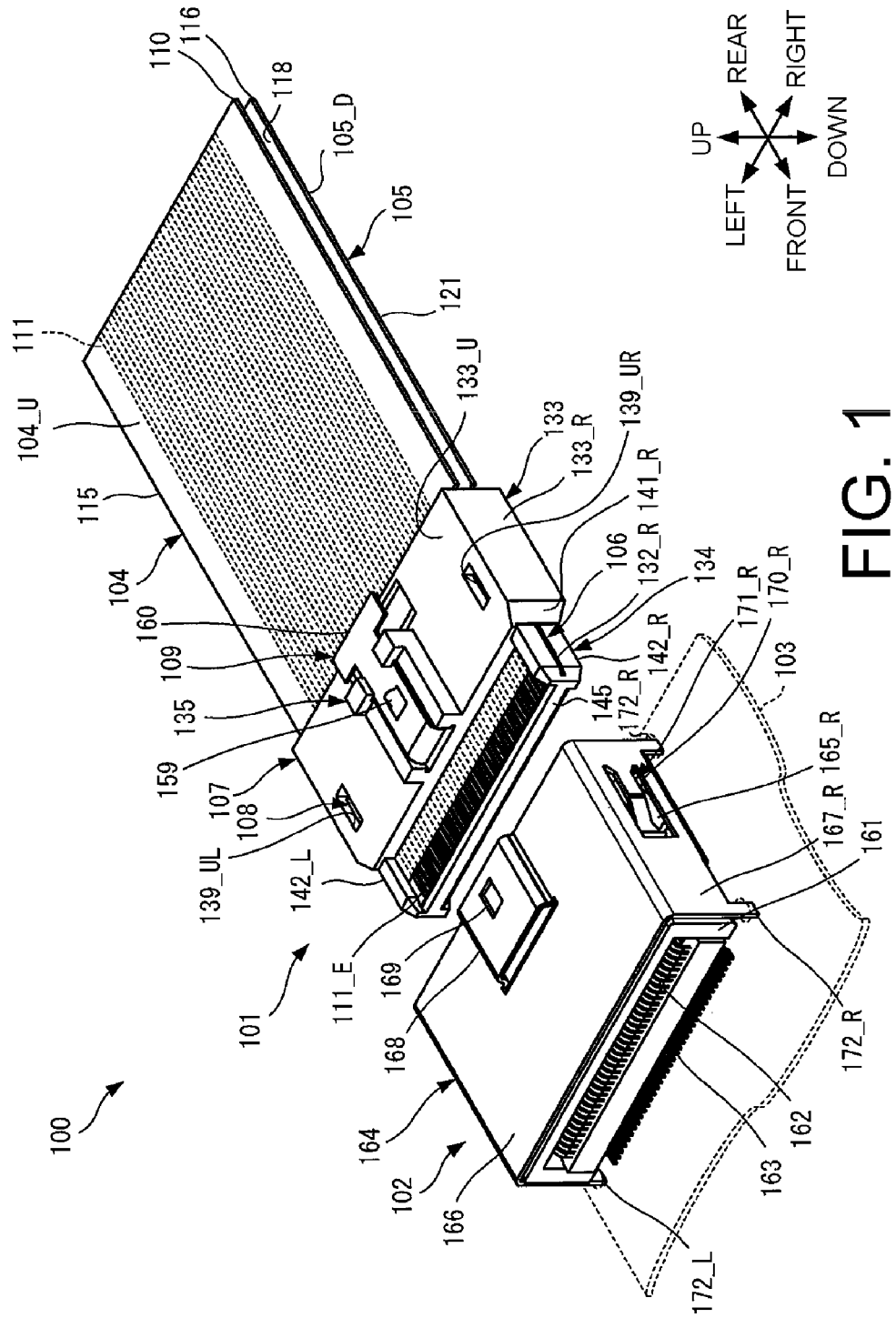
FIG. 1 is a perspective view of a plug and a receptacle, which form a connector assembly according to an embodiment of this invention, when seen obliquely from an upper front on a right.

As illustrated in FIG. 1, which is a perspective view, a connector assembly 100 according to an embodiment of this invention is an assembly configured to removably connect a plurality of signal wirings to other wirings, and includes a plug 101 and receptacle 102, which are to be fitted to each other. As illustrated in FIG. 1, the receptacle 102 is mounted to, for example, a substrate 103 or other such object by soldering or other such appropriate method.

The plug 101 in this embodiment corresponds to a connector. The receptacle 102 in this embodiment corresponds to a mating connector.

In this embodiment, a direction in which the receptacle 102 is positioned with respect to the plug 101 when the plug 101 and the receptacle 102 are fitted to each other is defined as "front", and an opposite direction thereof is defined as "rear". Further, a direction in which the substrate 103 is mounted to the receptacle 102 is defined as "lower", and an opposite direction thereof is defined as "upper". "Right" and "left" are defined when seen from the front. Those terms, which are "front", "rear", "upper", "lower", "left", and "right", are used to facilitate understanding of this embodiment, and are not intended to limit this invention.

(Configuration of Plug 101)

The plug 101 is a connector to which a plurality of signal wirings are connected, and includes a first wiring board 104, a second wiring board 105, a ground plate 106, a first insulator 107, a cover 108, and a first lock mechanism portion 109 as illustrated in FIG. 2 to FIG. 7.

Figure 2:
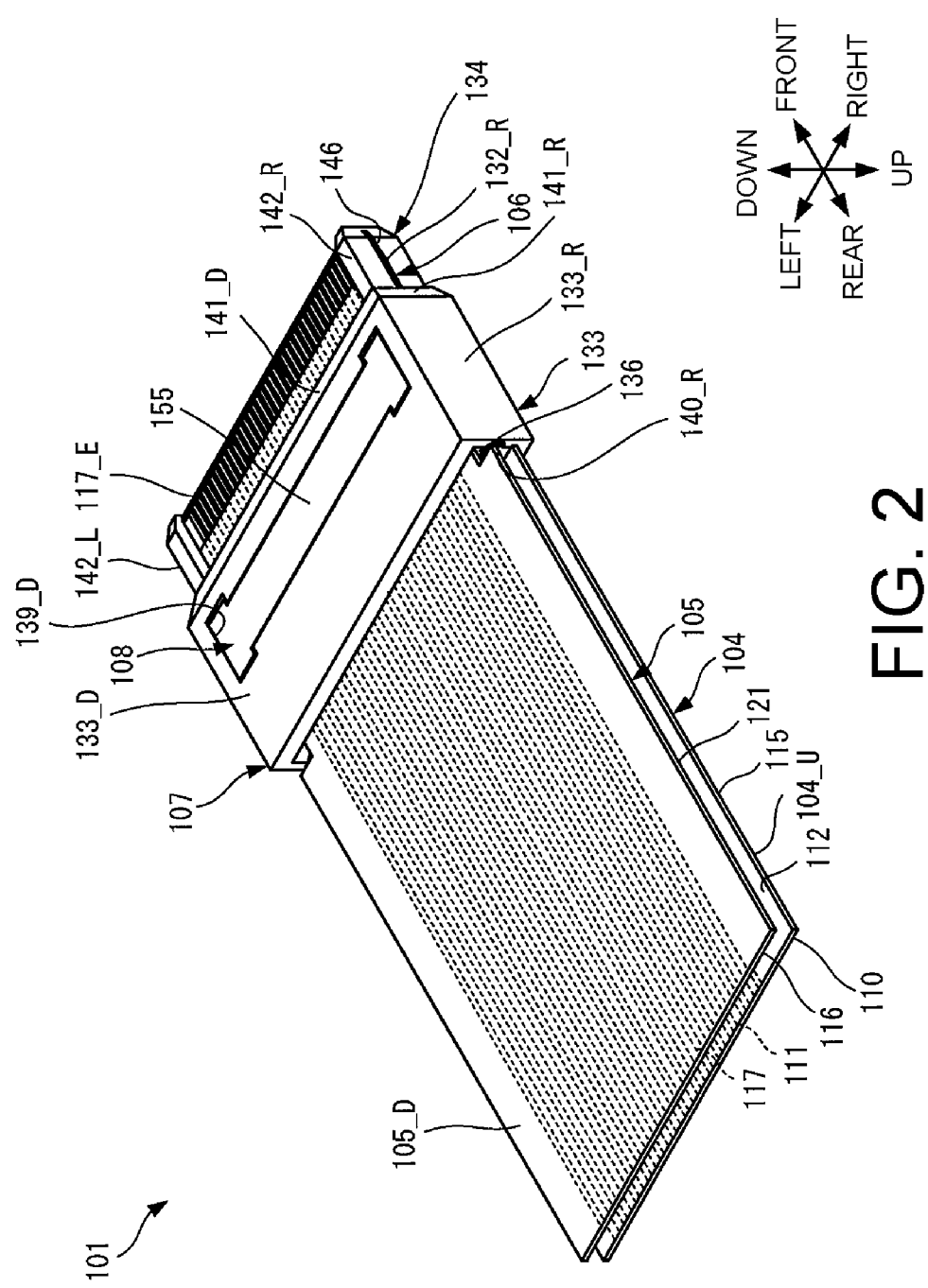
FIG. 2 is a perspective view of the plug in the embodiment when seen obliquely from a lower rear on the right.
Figure 3:
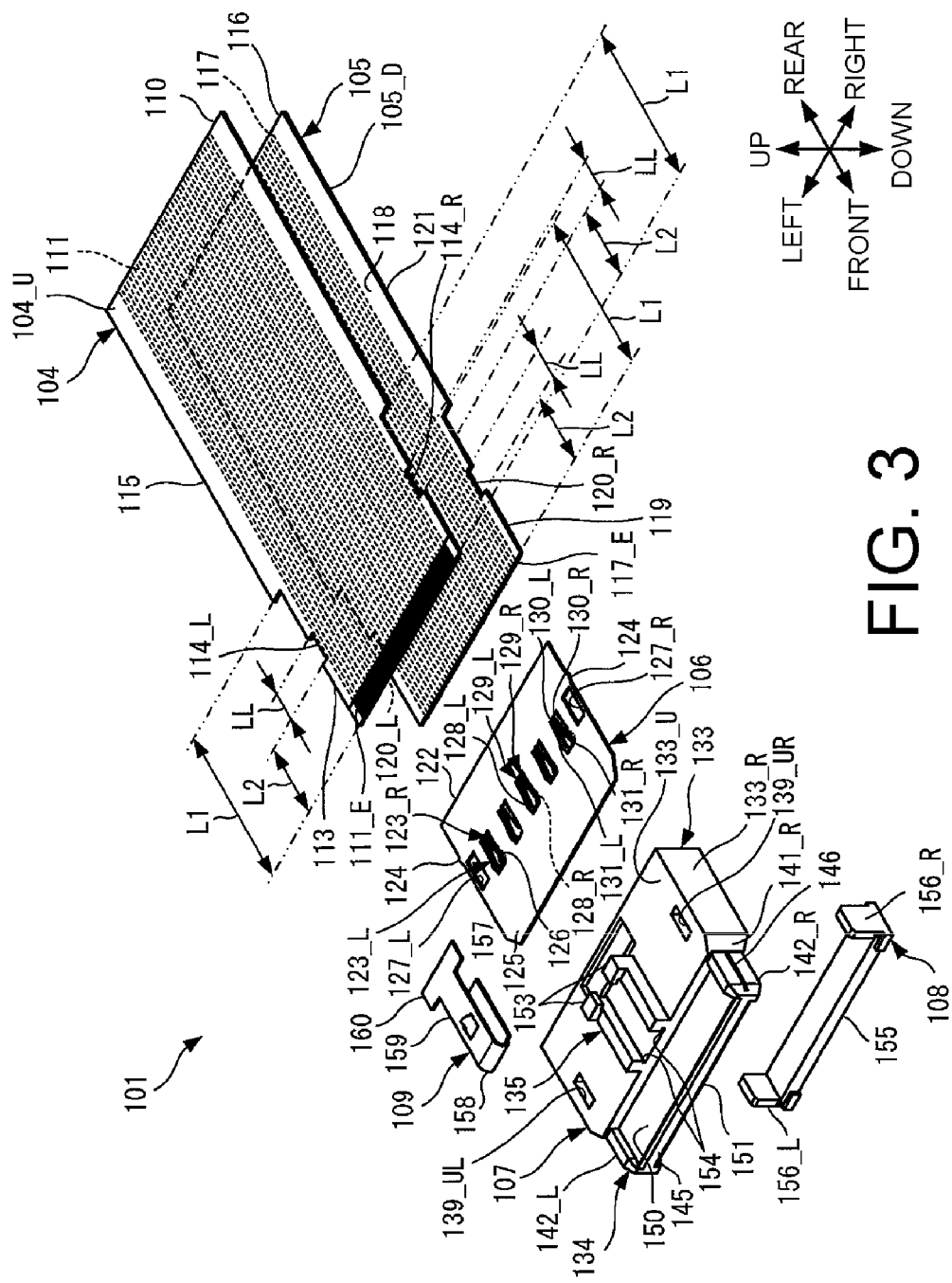
FIG. 3 is an exploded perspective view of the plug in the embodiment.

FIG. 2 is a perspective view of the plug 101 when seen from a direction different from that of FIG. 1. FIG. 3 is an exploded perspective view of the plug 101. FIG. 4 to FIG. 7 are a front view, a plan view, a right side view, and a rear view of the plug 101, respectively. A left side view of the plug 101 is illustrated similarly to the right side view.

The first wiring board 104 is a flexible plate-shaped member configured to transmit signals, and corresponds to a first flexible wiring board. The first wiring board 104 is typically, for example, a flexible flat cable (FFC) or a flexible printed circuit (FPC), which has a micro-strip line structure or a strip-line structure.

In this case, the micro-strip line structure or the strip line structure is a structure in which a ground conductor, for example, a conductor foil, which is connected to a reference potential, is provided on one main surface of a dielectric plate, and signal wirings, through which signals are transmitted, are provided on another main surface or inside of the dielectric plate. Such a structure is suitably applied to high frequency transmission in general.

Specifically, the first wiring board 104 includes a first dielectric plate 110, a plurality of first signal wirings 111, and a first ground conductor 112.

The first dielectric plate 110 is a thin plate-shaped member having an insulating property and flexibility, and is a rectangular thin film that is long in the longitudinal direction in this embodiment. A material of the first dielectric plate 110 is, for example, polyimide or other such resin. A thickness (length in up-down directions) of the first dielectric plate 110 is, for example, about 0.4 mm (millimeter).

Specifically, the first dielectric plate 110 includes a first held portion 113, a pair of first locking portions 114_L and 114_R, and a first extending portion 115.

The first held portion 113 is a portion extending from a front end of the first dielectric plate 110 to have a predetermined length L1. A portion of the first held portion 113 extending from the front end portion (distal end portion) to have a predetermined length is held inside the first insulator 107 (see FIG. 3 and FIG. 14).

Each of the pair of first locking portions 114_L and 114_R is a portion having a recess formed inward from a left end portion and a right end portion of the first held portion 113 (that is, to the right at the left end portion, and to the left at the right end portion). In this embodiment, each of the pair of first locking portions 114_L and 114_R is formed at a position away from the front end by a predetermined length L2, and forms a substantially rectangular recess elongated in the longitudinal direction, which has a depth (length in the longitudinal direction) having a predetermined length LL (see FIG. 3 and FIG. 14).

With this configuration, each of the pair of first locking portions 114_L and 114_R forms parallel side portions, which extend in a transverse direction at the position of the length L2 from the front end and at the position away therefrom by the length LL, and a side portion, which extends in the longitudinal direction to connect inner end portions of the side portions.

The first extending portion 115 is a substantially rectangular portion that is long in the longitudinal direction, and is connected to a rear end of the first held portion 113. The first extending portion 115 is connected to the rear end of the first held portion 113 via a step, and hence a width of the first extending portion 115 is wider than that of the first held portion 113. The width indicates a length to sides, that is, a length in the transverse direction in this embodiment, and is an arrangement direction of the first signal wirings 111 described later.

Each of the plurality of first signal wirings 111 is a wiring configured to transmit a signal, and is formed of a linear conductor extending in the longitudinal direction. The plurality of first signal wirings 111 are arranged in parallel inside the first dielectric plate 110 at predetermined intervals in the transverse direction.

Each of the plurality of first signal wirings 111 in this embodiment includes a first exposed-wiring portion 111_E in a portion corresponding to a predetermined length from the front end. The first exposed-wiring portion 111_E is a portion in which the first dielectric plate 110 is not provided at least thereabove so as to expose the first signal wirings 111 at least upward to the outside.

The first ground conductor 112 is a conductor connected to a reference potential, and is, for example, a metal foil. The first ground conductor 112 is a metal layer provided so as to extend substantially entirely on a lower surface of the first dielectric plate 110, which corresponds to one main surface of the first dielectric plate 110.

A metal foil or other such conductor to be connected to the reference potential may be provided so as to extend substantially entirely as a third ground conductor on an upper surface of the first dielectric plate 110, which corresponds to another main surface of the first dielectric plate 110, that is, on the main surface in a direction different from the first ground conductor 112 across the first signal wirings 111. Further, for example, the plurality of first signal wirings 111 may be provided on an upper surface of the first dielectric plate 110 rather than inside the first dielectric plate 110.

The second wiring board 105 is a flexible plate-shaped member configured to transmit signals, and corresponds to a second flexible wiring board. The second wiring board 105 has substantially the same configuration as that of the first wiring board 104, and is provided on a lower side of the first wiring board 104 so as to be substantially parallel to the first wiring board 104 under a state of being upside down with respect to the first wiring board 104.

That is, the second wiring board 105 includes a second dielectric plate 116, a plurality of second signal wirings 117, and a second ground conductor 118, which correspond to the first dielectric plate 110, the plurality of first signal wirings 111, and the first ground conductor 112 of the first wiring board 104, respectively.

Similarly to the first dielectric plate 110, the second dielectric plate 116 is a thin plate-shaped member having an insulating property and flexibility, and is a rectangular thin film that is long in the longitudinal direction in this embodiment. Specifically, the second dielectric plate 116 includes a second held portion 119, a pair of second locking portions 120_L and 120_R, and a second extending portion 121, which correspond to the first held portion 113, the pair of first locking portions 114_L and 114_R, the first extending portion 115, respectively.

The second held portion 119 is a portion extending from a front end of the second dielectric plate 116 to have the predetermined length L1. A portion of the second held portion 119 from the front end portion (distal end portion) to a predetermined length is held inside the first insulator 107 (see FIG. 3 and FIG. 14).

Each of the pair of second locking portions 120_L and 120_R is a portion having a recess formed inward from a left end portion and a right end portion of the second held portion 119. Each of the pair of second locking portions 120_L and 120_R is formed at a position away from the front end by the predetermined length L2, and forms a substantially rectangular recess elongated in the longitudinal direction, which has a depth having the predetermined length LL (see FIG. 3 and FIG. 14).

With this configuration, similarly to the pair of first locking portions 114_L and 114_R, each of the pair of second locking portions 120_L and 120_R forms parallel side portions, which extend in a transverse direction at the position of the length L2 from the front end and at the position away therefrom by the length LL, and a side portion, which extends in the longitudinal direction.

The second extending portion 121 is a substantially rectangular portion, which is long in the longitudinal direction, and is connected to a rear end of the second held portion 119. The second extending portion 121 is connected to the rear end of the second held portion 119 via a step, and hence a width of the second extending portion 121 is wider than that of the first held portion 113.

Similarly to each of the plurality of first signal wirings 111, each of the plurality of second signal wirings 117 is a wiring configured to transmit a signal, and is formed of a linear conductor extending in the longitudinal direction. The plurality of first signal wirings 111 are arranged in parallel inside the second dielectric plate 116 at predetermined intervals in the transverse direction.

Each of the plurality of second signal wirings 117 in this embodiment includes a second exposed-wiring portion 117_E in a portion corresponding to a predetermined length from the front end. The second exposed-wiring portion 117_E is a portion in which the second dielectric plate 116 is not provided at least therebelow so as to expose the second signal wirings 117 at least downward to the outside.

Similarly to the first ground conductor 112, the second ground conductor 118 is a conductor connected to the reference potential, and is, for example, a metal foil. The second ground conductor 118 is a metal layer provided to extend substantially entirely on a lower surface of the second dielectric plate 116, which corresponds to one main surface of the second dielectric plate 116. That is, the first ground conductor 112 and the second ground conductor 118 are provided so as to face to each other in the up-down directions.

A metal foil or other such conductor to be connected to the reference potential may be provided to extend substantially entirely as a fourth ground conductor on an upper surface of the second dielectric plate 116, which corresponds to another main surface of the second dielectric plate 116, that is, on the main surface in a direction different from the second ground conductor 118 across the second signal wirings 117. Further, for example, the plurality of second signal wirings 117 may be provided on an upper surface of the second dielectric plate 116 rather than inside the second dielectric plate 116.

The ground plate 106 is a plate-shaped member to be connected to the reference potential, and is provided between the first wiring board 104 and the second wiring board 105. A material of the ground plate 106 is metal or other such conductor.

Specifically, the ground plate 106 includes a main plate portion 122, five pairs of elastic contact point portions 123_L and 123_R, a pair of protrusions 124, and a protected portion 125.

The main plate portion 122 is a substantially rectangular thin plate-shaped portion that is long in the transverse direction, and has a thickness of, for example, about 0.2 mm. The main plate portion 122 in this embodiment has five long hole portions 126 and a pair of third locking portions 127_L and 127_R.

Each of the long hole portions 126 is a portion in which a hole penetrating in the up-down directions direction is formed, and has a long rectangular shape in the longitudinal direction when seen from the upper side. In this embodiment, the five long hole portions 126 are formed in line to be laterally symmetric approximately at a center of the main plate portion 122 in the longitudinal direction.

Note that, the number of long hole portions 126 is not limited to five, and may be one or more. Further, when a plurality of long hole portions 126 are formed, the plurality of long hole portions 126 may be formed in the main plate portion 122 in an appropriate arrangement. However, in order to press the first wiring board 104 and the second wiring board 105 toward the upper and the lower sides, respectively, it is desired that the long hole portions 126 be formed to be laterally symmetric.

The pair of third locking portions 127_L and 127_R are portions which are provided on the left and the right of the five long hole portions 126 and in which through holes penetrating in the up-down directions are formed. Each of the third locking portions 127_L and 127_R has a long rectangular shape in the longitudinal direction when seen from the upper side.

Each pair of elastic contact point portions 123_L and 123_R is provided in correspondence with any one of the long hole portions 126 different from each other. Each of the elastic contact point portions 123_L and 123_R in this embodiment is brought into contact with each of the first ground conductor 112 and the second ground conductor 118 under a state of being pressed with an elastic force of each of the elastic contact point portions 123_L and 123_R.

Specifically, the elastic contact point portions 123_L and 123_R are two plate spring contact points extending in parallel, in which one end portions are fixed ends fixed to the main plate portion 122 and another end portions are free ends. Each pair of elastic contact point portions 123_L and 123_R includes first contact points 128_L and 128_R, and first elastic portions 129_L and 129_R.

The first contact points 128_L and 128_R are points to be brought into contact with the first ground conductor 112 and the second ground conductor 118, respectively.

The first contact point 128_L in this embodiment is a portion extending from the free end of the elastic contact point portion 123_L to have a predetermined length, and is formed into a mountain shape to protrude upward. The first contact point 128_L is brought into contact with the first ground conductor 112 mainly in the vicinity of a highest point.

Further, the first contact point 128_R is a portion extending from the free end of the elastic contact point portion 123_R to have a predetermined length, and is formed in a valley shape to protrude downward. The first contact point 128_R is brought into contact with the second ground conductor 118 mainly in the vicinity of a lowest point.

The first elastic portions 129_L and 129_R are portions having elasticity to apply forces toward the first ground conductor 112 and the second ground conductor 118 to the first contact points 128_L and 128_R, respectively. The first elastic portions 129_L and 129_R in this embodiment are each connected to the main plate portion 122, and extend obliquely to an upper front or a lower front to be connected to the first contact points 128_L and 128_R, respectively.

The first elastic portions 129_L and 129_R in this embodiment includes base end portions 130_L and 130_R and plate-shaped portions 131_L and 131_R, respectively.

The base end portion 130_L is a portion that is connected to the main plate portion 122, and is curved or bent toward the upper front. The base end portion 130_R is a portion that is connected to the main plate portion 122, and is curved or bent toward the lower front.

The plate-shaped portion 131_L is an elongated plate-shaped portion, which extends obliquely from the base end portion 130_L toward the upper front to be connected to the first contact point 128_L. As a result, the first contact point 128_L is positioned closer to a front end portion (distal end portion) of the ground plate 106 than the base end portion 130_L.

The plate-shaped portion 131_R is an elongated plate-shaped portion, which extends obliquely from the base end portion 130_R toward the upper front to be connected to the first contact point 128_R. As a result, the first contact point 128_R is positioned closer to the front end portion of the ground plate 106 than the base end portion 130_R.

The pair of protrusions 124 is small protrusions protruding from a left end portion and a right end portion of the main plate portion 122 toward a left and a right, respectively. The pair of protrusions 124 in this embodiment is provided rearward of the long hole portions 126 in the longitudinal direction.

The number of protrusions 124 may be one or the protrusions 124 may not be provided, as long as a structure in which the ground plate 106 is held under a state of being press-fitted and pressed in the first insulator 107 as described later in detail is formed.

The protected portion 125 is a portion extending from a distal end portion of the ground plate 106 to have a predetermined length, and is a portion accommodated in a protecting portion 134 described later. The protected portion 125 includes exposed-plate portions 132_L and 132_R, which are exposed to the outside from the protecting portion 134 in a vicinity of the left end portion and a vicinity of the right end portion.

In this embodiment, the ground plate 106 having the configuration described above is integrally formed. In the ground plate 106, a part or all of the plurality of first contact points 128_L and 128_R, the first elastic portions 129_L and 129_R, and the main plate portion 122 may be formed by separate members and may be electrically connected by soldering or the like.

Figure 8:
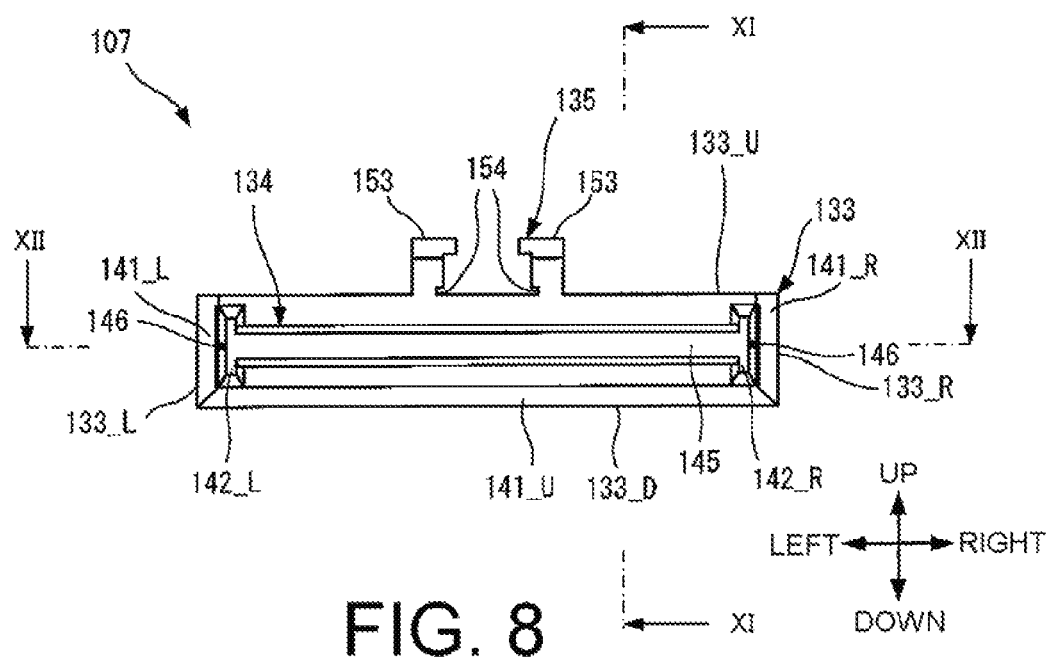
FIG. 8 is a front view of a first insulator in the embodiment.
Figure 9:
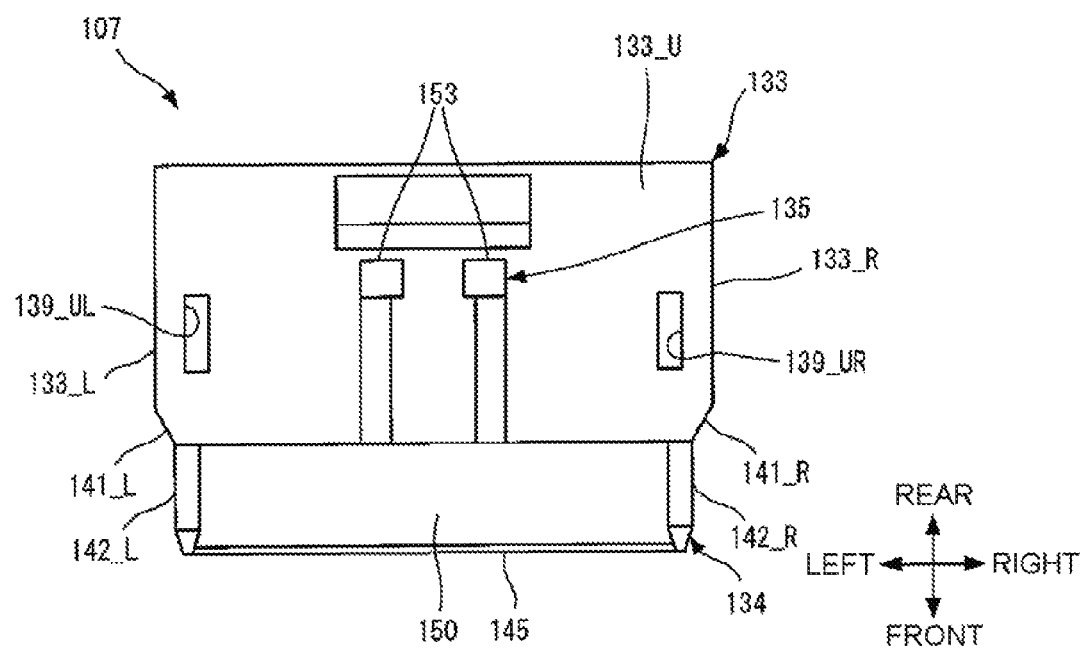
FIG. 9 is a plan view of the first insulator in the embodiment.
Figure 10:
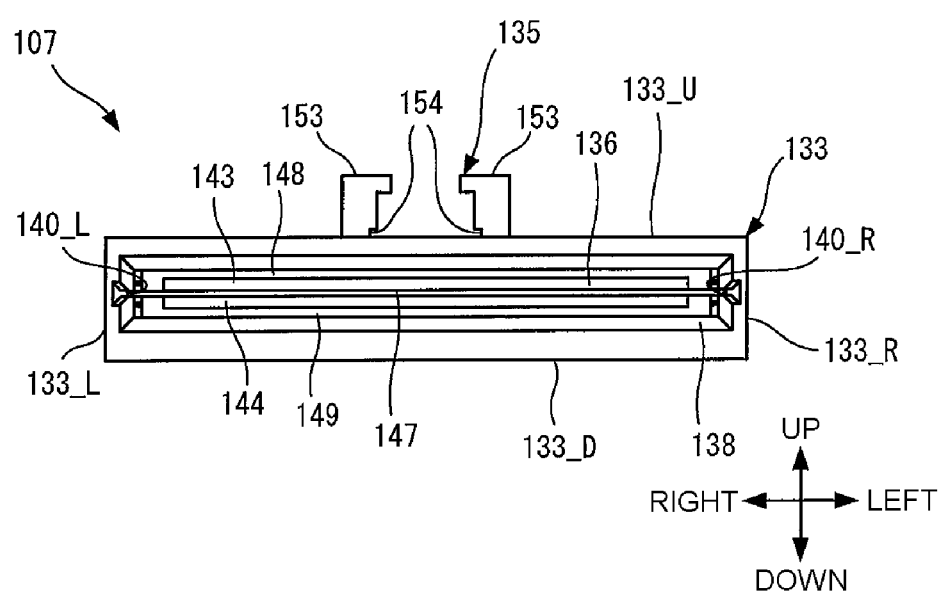
FIG. 10 is a rear view of the first insulator in the embodiment.
Figure 11:
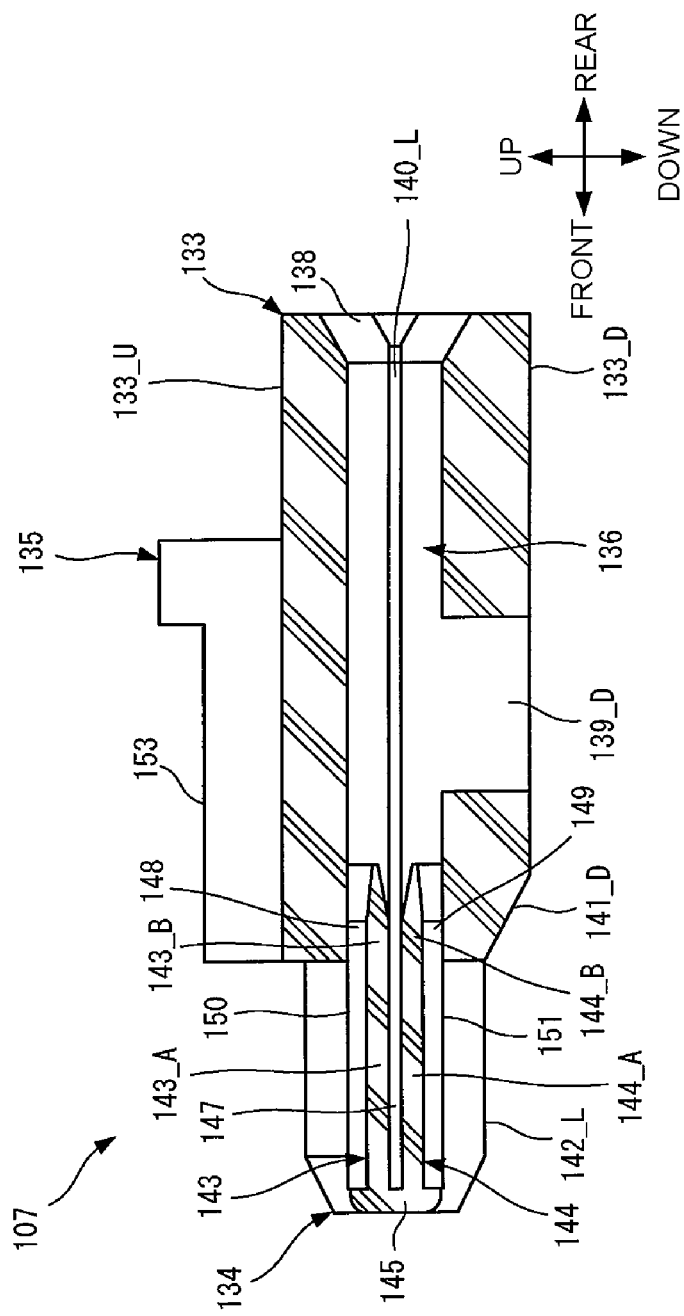
FIG. 11 is a sectional view taken along the line XI-XI of FIG. 8.
Figure 12:
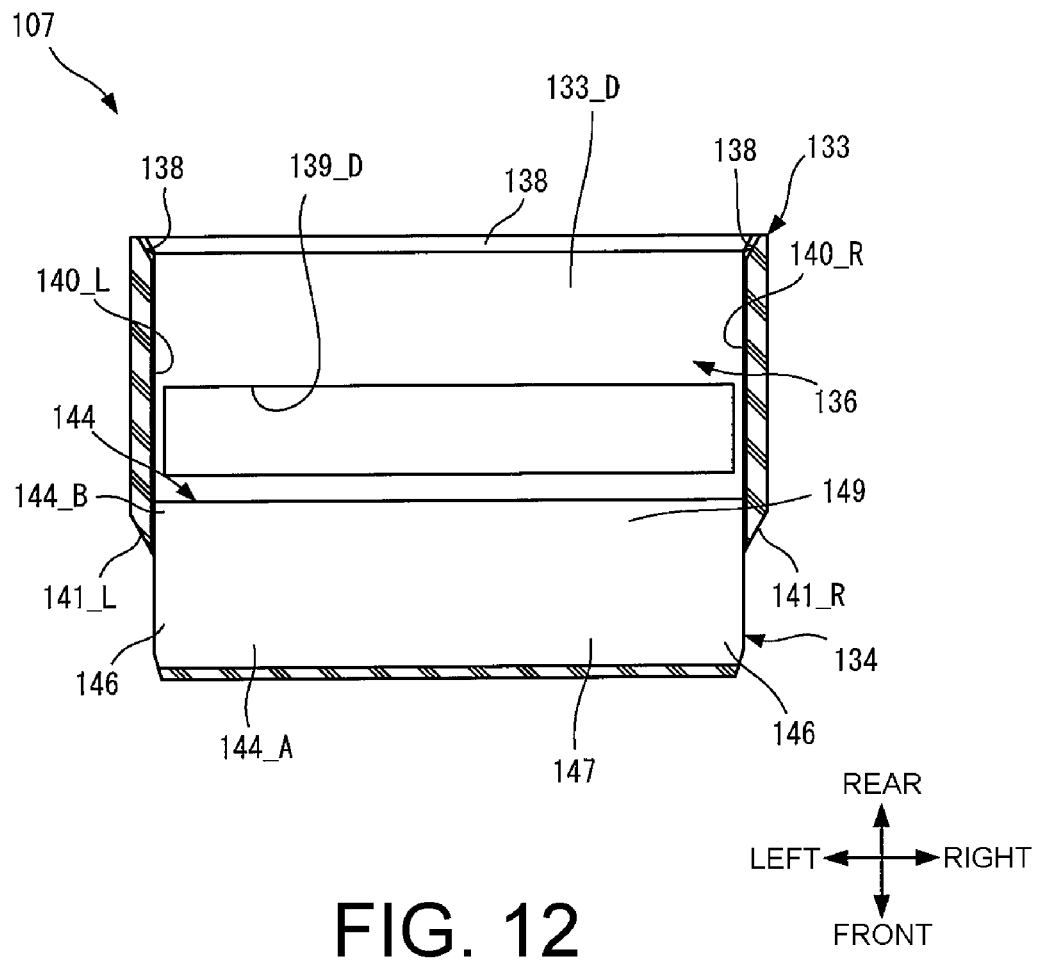
FIG. 12 is a sectional view taken along the line XII-XII of FIG. 8.

The first insulator 107 is a member configured to hold the first wiring board 104, the second wiring board 105, and the ground plate 106. As illustrated in FIG. 8 to FIG. 10, which are external views, and in FIG. 11 and FIG. 12, which are sectional views, the first insulator 107 in this embodiment includes a main body portion 133, the protecting portion 134, and a lock mechanism mount portion 135. The first insulator 107 is integrally made of, for example, resin as a material. FIG. 8 to FIG. 10 are a front view, a plan view, and a rear view of the first insulator 107, respectively. Further, FIG. 11 and FIG. 12 are sectional views of the first insulator 107 taken along the line XI-XI and the line XII-XII of FIG. 8, respectively.

The main body portion 133 and the protecting portion 134 are portions that internally form an accommodation space 136, in which the first wiring board 104, the second wiring board 105, and the ground plate 106 are accommodated. The main body portion 133 and the protecting portion 134 form the accommodation space 136 so as to cover at least portions of respective five portions including front end portions (distal end portions), both the left and right end portions, and two main surface portions 104_U and 105_D, which face outward, of a whole of the first wiring board 104, the second wiring board 105, and the ground plate 106.

As described later in detail, in this embodiment, the entire front end portion of the first wiring board 104, the second wiring board 105, and the ground plate 106 is a front end portion of each of the first wiring board 104, the second wiring board 105, and the ground plate 106.

Both the right and left end portions of the entire first wiring board 104, the second wiring board 105, and the ground plate 106 are respective right end portions and left end portions of the first wiring board 104, the second wiring board 105, and ground plate 106.

The two main surface portions, which face outward, of the entire first wiring board 104, the second wiring board 105, and the ground plate 106 are the upper surface portion 104_U of the first wiring board 104 and the lower surface portion 105_D of the second wiring board 105.

As illustrated in FIG. 8 to FIG. 10, the main body portion 133 is a portion having an outer shape of a substantially rectangular parallelepiped, and is formed by an upper wall portion 133_U, a lower wall portion 133_D, a left wall portion 133_L, and a right wall portion 133_R, each having a flat plate shape. As a result, a portion of the substantially rectangular parallelepiped accommodation space 136 is formed inside the main body portion 133.

The ground plate 106, and the first wiring board 104 and the second wiring board 105, which are provided above and below the ground plate 106, respectively, are accommodated in the accommodation space 136 formed by the main body portion 133. In other words, the main body portion 133 covers portions of both the left and right side end portions of each of the ground plate 106, the first wiring board 104, and the second wiring board 105, a portion of the upper surface portion 104_U of the first wiring board 104, and a portion of the lower surface portion 105_D of the second wiring board 105.

The first wiring board 104 is provided such that the upper surface portion 104_U thereof is brought into contact with an inner surface (lower surface) of the upper wall portion 133_U. The second wiring board 105 is provided such that the lower surface portion 105_D thereof is brought into contact with an inner surface (upper surface) of the lower wall portion 133_D. As a result, each of the first ground conductor 112 and the second ground conductor 118 is provided to face the ground plate 106 in the up-down directions.

As described above, each of the first contact points 128_L and 128_R of the ground plate 106 is brought into contact with the first ground conductor 112 and the second ground conductor 118, respectively. On this occasion, the respective first contact points 128_L and 128_R of the ground plate 106 receives forces toward the first ground conductor 112 and the second ground conductor 118 by elastic forces of the first elastic portions 129_L and 129_R.

As a result, the ground plate 106 is securely brought into electrical contact with each of the first ground conductor 112 and the second ground conductor 118 to be electrically conducted. Further, the first wiring board 104 and the second wiring board 105 are held inside the main body portion 133 under a state of being pressed by the upper wall portion 133_U and the lower wall portion 133_D, respectively.

Specifically, a tapered portion 138, a cover mount portions 139_UL, 139_UR, and 139_D, plate guide groove portions 140_L and 140_R, and inclined portions 141_L, 141_R, and 141_D are provided in the main body portion 133.

The tapered portion 138 is a portion for gradually reducing the accommodation space 136 in size from a rear end portion toward the front. The tapered portion 138 is provided in vicinities of the rear ends of the inner surfaces of the respective upper wall portion 133_U, the lower wall portion 133_D, the left wall portion 133_L, and the right wall portion 133_R.

The cover mount portions 139_UL, 139_UR, and 139_D are portions configured to mount the cover 108, which is described later in detail, and are provided in the upper wall portion 133_U and the lower wall portion 133_D. Each of the cover mount portions 139_UL, 139_UR, and 139_D corresponds to a fitting retainer portion.

Specifically, each of the cover mount portions 139_UL and 139_UR has a through hole penetrating in the up-down directions in the upper wall portion 133_U, and forms a substantially elongated rectangular shape in the longitudinal direction when seen from the upper side. The cover mount portion 139_UL is provided in a vicinity of a left end of the upper wall portion 133_U. The cover mount portion 139_UR is provided in a vicinity of a right end of the upper wall portion 133_U. The cover mount portion 139_D has a through hole penetrating in the up-down directions in the lower wall portion 133 _D, and has a substantially long rectangular shape in the transverse direction, which extends between the vicinity of the left end and the vicinity of the right end of the lower wall portion 133_D when seen from the upper side.

In this embodiment, the cover mount portions 139_UL, 139_UR, and 139_D, which have substantially the same length, are provided at substantially the same positions slightly toward the front with respect to centers of the upper wall portion 133_U and the lower wall portion 133_D in the longitudinal direction. Further, respective positions of the left end portion and the right end portion of the cover mount portion 139_D in the transverse direction are substantially the same as those of the left end portion of the cover mount portion 139_UL and the right end portion of the cover mount portion 139_UR.

The plate guide groove portions 140_L and 140_R are portions configured to hold the ground plate 106, and form elongated grooves, which extend in the longitudinal direction in respective inner surfaces of the left wall portion 133_L and the right wall portion 133_R. The respective plate guide groove portions 140_L and 140_R are formed such that positions thereof in the up-down directions are aligned so as to face each other in the transverse direction, and the left end portion and the right end portion of the ground plate 106 are fitted therein. As a result, the ground plate 106 is held in the first insulator 107.

Specifically, respective intervals in the up-down directions of the plate guide groove portions 140_L and 140_R are such lengths in which the ground plate 106 can be provided, and is slightly larger than a thickness of the ground plate 106. Respective vicinities at rear ends of the plate guide groove portions 140_L and 140_R are widened outward to facilitate mounting of the ground plate 106 to the first insulator 107.

Further, a left end portion and a right end portion of the plate guide groove portions 140_L and 140_R are provided at intervals in which the pair of protrusions 124 can move while being rubbed. As a result, the first insulator 107 holds the ground plate 106 under a state in which the pair of protrusions 124 is pressed directly from the right and the left.

The inclined portions 141_L, 141_R, and 141_D are portions that are inclined so as to have small widths or thin thicknesses in the vicinities at respective front ends of outer surfaces of the left wall portion 133_L, the right wall portion 133_R, and the lower wall portion 133_D.

The protecting portion 134 is provided to substantially protrude forward of the main body portion 133, and is a portion to be fitted to the receptacle 102. A remaining portion of the accommodation space 136, which is continuous to a portion of the accommodation space 136 formed by the main body portion 133, is formed inside the protecting portion 134.

Vicinities of the distal end portions of the respective first wiring board 104, the second wiring board 105, and the ground plate 106 are accommodated in the accommodation space 136 formed by the protecting portion 134. In this case, the vicinity of the distal end portion is a portion including the distal end portion, and is a portion extending from the distal end portion to have a predetermined length. The vicinity of the distal end portion of the ground plate 106 is the protected portion 125. The protecting portion 134 has a width narrower than that of the main body portion 133 so as to expose a left end portion and a right end portion of the protected portion 125 to the outside of the protecting portion 134.

Specifically, the protecting portion 134 includes left and right side wall portions 142_L and 142_R, a first partition portion 143, a second partition portion 144, and a distal end protecting portion 145.

Each of the respective side wall portions 142_L and 142_R is provided frontward of the main body portion 133, and is a substantially rectangular parallelepiped portion, which forms a side end portion of the protecting portion 134. Slit portions 146, which continuously extend forward from the plate guide groove portions 140_L and 140_R, are formed substantially at centers in the up-down directions of the respective side wall portions 142_L and 142_R. Spaces formed by the slit portions 146 are portions of a plate holding groove 147, which is described later.

Further, the sizes of vicinities of respective front ends of the side wall portions 142_L and 142_R are reduced toward the front to facilitate fitting to the receptacle 102.

The respective first partition portion 143 and the second partition portion 144 are substantially rectangular flat plate-shaped portions extending in the front, the rear, the left, and the right, and respective left and right end portions thereof are connected to the side wall portions 142_L and 142_R. The first partition 143 and the second partition 144 each have a thickness of, for example, about 0.4 mm.

The first partition 143 and the second partition 144 are arrayed in up-down directions with a gap, a length of which in the up-down directions is slightly longer than the thickness of the ground plate 106. The gap forms the plate holding groove 147 together with the space formed by the above-mentioned slit portion 146.

The plate holding groove 147 is the accommodation space 136, in which the protected portion 125 of the ground plate 106 is accommodated, and a length in the up-down directions of a vicinity of a rear end thereof is made long rearward to facilitate mounting of the ground plate 106 to the first insulator 107.

In this case, widths of the side wall portions 142_L and 142_R are narrower than that of the main body portion 133 to an extent that the exposed-plate portions 132_L and 132_R are exposed.

In this embodiment, the widths of the side wall portions 142_L and 142_R are lengths in the transverse direction of respective outer surfaces (a left side surface of the side wall portion 142_L and a right side surface of the side wall portion 142_R) of the side wall portions 142_L and 142_R. The widths of the side wall portions 142_L and 142_R are substantially the same as the length in the transverse direction between inner surfaces of the left wall portion 133_L and the right wall portion 133_R of the main body portion 133. As a result, a portion, which is provided forward of the plate guide groove portions 140_L and 140_R, of the ground plate 106 is exposed to the outside of the protecting portion 134 as the exposed-plate portions 132_L and 132_R.

Further, the first partition portion 143 includes a first protruding portion 143_A and a first accommodation portion 143_B. The first protruding portion 143_A is a portion which protrudes forward of a front end portion of the main body portion 133. The first accommodation portion 143_B is a portion which protrudes rearward of the front end portion of the main body portion 133, and is provided inside the main body portion 133.

With this configuration, the first accommodation portion 143_B and the upper wall portion 133_U form a first insertion hole 148. The first insertion hole 148 is a portion of the accommodation space 136 in which the first wiring board 104 is provided therethrough in the longitudinal direction. A length in the up-down directions of a vicinity of a rear end of the first insertion hole 148 is made long rearward to facilitate mounting of the first wiring board 104 to the first insulator 107.

Further, the first protruding portion 143_A forms the accommodation space 136, in which the vicinity of the distal end portion of the first wiring board 104 is accommodated on an upper side thereof. The vicinity of the distal end portion of the first wiring board 104 is provided on the first protruding portion 143_A such that the lower surface (that is, the first ground conductor 112 in this embodiment) of the first wiring board 104 is brought into contact with the upper surface of the first protruding portion 143_A.

Further, similarly to the first partition portion 143, the second partition portion 144 includes a second protruding portion 144_A and a second accommodation portion 144_B. The second protruding portion 144_A is a portion which protrudes forward of a front end portion of the main body portion 133. The second accommodation portion 144_B is a portion which protrudes rearward of the front end portion of the main body portion 133, and is provided inside the main body portion 133.

With this configuration, the second accommodation portion 144_B and the lower wall portion 133_U form a second insertion hole 149. The second insertion hole 149 is a portion of the accommodation space 136 in which the second wiring board 105 is provided therethrough in the longitudinal direction. A length in the up-down directions of a vicinity of a rear end of the second insertion hole 149 is made long rearward to facilitate mounting of the second wiring board 105 to the first insulator 107.

Further, the second protruding portion 144_A forms the accommodation space 136, in which the vicinity of the distal end portion of the second wiring board 105 is accommodated on a lower side thereof. The vicinity of the distal end portion of the second wiring board 105 is provided on the second protruding portion 144_A such that the upper surface (that is, the second ground conductor 118 in this embodiment) of the second wiring board 105 is brought into contact with the lower surface of the second protruding portion 144_A.

The distal end protecting portion 145 is a portion having a substantially rectangular flat shape elongated in the transverse direction, and a rear surface thereof is continuously connected to front ends of the first protruding portion 143_A and the second protruding portion 144_A over a substantially entire width in the transverse direction. As a result, the distal end protecting portion 145 reinforces the vicinities of the distal ends of the first protruding portion 143_A and the second protruding portion 144_A.

With such reinforcement, it is possible to reduce a fear that the plug 101 is damaged due to, for example, curving or separation of the first protruding portion 143_A and the second protruding portion 144_A from each other, which are relatively thin portions.

An upper end portion of the distal end protecting portion 145 extends upward to cover at least a part of the front end of the first wiring board 104 provided in the first protruding portion 143_A when seen from the side. An upper side of a front surface of the distal end protecting portion 145 is curved to protrude upper forward such that a length thereof in the up-down directions gradually increases from the front to the rear.

A lower end portion of the distal end protecting portion 145 extends downward to cover at least a part of the front end of the second wiring board 105 provided in the second protruding portion 144_A when seen from the side. A lower side of a front surface of the distal end protecting portion 145 is curved to protrude lower forward such that a length thereof in the up-down directions gradually increases from the front to the rear.

The distal end protecting portion 145 forms a first opening 150 and a second opening 151 together with the side wall portions 142_L and 142_R, and the upper wall portion 133_U and the lower wall portion 133_D of the main body portion 133.

The first opening 150 is an opening which connects the accommodation space 136 formed by the first protruding portion 143_A to the outside toward an upper side. The first opening 150 in this embodiment is formed by the upper end portion of the distal end protecting portion 145, the side wall portions 142_L and 142_R, and the upper wall portion 133_U.

As described above, the vicinity of the distal end portion of the first wiring board 104 is provided on the first protruding portion 143_A so as to come into contact with the first ground conductor 112. Further, the first exposed-wiring portion 111_E described above is provided in the vicinity of the distal end portion of the first wiring board 104. Therefore, the first exposed-wiring portion 111_E, that is, portions of the respective first signal wirings 111, are exposed to an outside of the first insulator 107 via the first opening 150.

The second opening 151 is an opening which connects the accommodation space 136 formed by the second protruding portion 144_A to the outside toward a lower side. The second opening 151 in this embodiment is formed by the lower end portion of the distal end protecting portion 145, the side wall portions 142_L and 142_R, and the lower wall portion 133_D.

As described above, the vicinity of the distal end portion of the second wiring board 105 is provided on the second protruding portion 144_A so as to come into contact with the second ground conductor 118. Further, the second exposed-wiring portion 117_E described above is provided in the vicinity of the distal end portion of the second wiring board 105. Therefore, the second exposed-wiring portion 117_E, that is, portions of the respective second signal wirings 117, are exposed to the outside of the first insulator 107 via the second opening 151.

The lock mechanism mount portion 135 is a portion configured to mount the first lock mechanism portion 109, which is described later in detail, and is provided at a center of a front of the upper wall portion 133_U in this embodiment.

The lock mechanism mount portion 135 in this embodiment includes a pair of protruding-shaped portions 153, each of which protrudes upward from the upper surface of the upper wall portion 133_U, and extends in the longitudinal direction. The pair of protruding-shaped portions 153 is provided in the vicinity of the front end portion of the upper wall portion 133_U, and is provided to face each other across an approximate center. Each of the protruding-shaped portions 153 has an elongated notch of a substantially rectangular parallelepiped, which extends in the longitudinal direction, at a lower end portion of a surface facing another protruding-shaped portion 153. As a result, the pair of protruding-shaped portions 153 forms a slide groove portion 154 together with the upper surface of the upper wall portion 133_U.

The cover 108 is a member which is mounted to the cover mount portions 139_UL, 139_UR, 139_D, and is integrally made of, for example, resin as a material. The cover 108 corresponds to a retainer member. The cover 108 includes a lid portion 155 to be fitted to the cover mount portion 139_D, and retainer portions 156_L and 156_R to be fitted to the cover mount portions 139_UL and 139_UR.

The lid portion 155 is a substantially rectangular parallelepiped portion that is long in the transverse direction. The lid portion 155 is fitted to, for example, the cover mount portion 139_D by interference-fit to close a through hole formed by the cover mount portion 139_D to be fixed therein.

The respective retainer portions 156_L and 156_R are substantially rectangular parallelepiped portions that extend upward from a left end portion and a right end portion of the lid portion 155. The retainer portions 156_L and 156_R are fitted to, for example, the cover mount portions 139_UL and 139_UR by interference-fit to close the through holes formed by the cover mount portions 139_UL and 139_UR to be fixed therein.

In this case, when the first wiring board 104, the second wiring board 105, and the ground plate 106 are held in the first insulator 107, the cover mount portion 139_D, the first locking portion 114_L, the second locking portion 120_L, the third locking portion 127_L, and the cover mount portion 139_UL are aligned in the up-down directions. Together with the arrangement, the cover mount portion 139_D, the first locking portion 114_R, the second locking portion 120_R, the third locking portion 127_R, and the cover mount portion 139_UR are aligned in the up-down directions.

With this configuration, the cover mount portion 139_D, the first locking portion 114_L, the second locking portion 120_L, the third locking portion 127_L, and the cover mount portion 139_UL form a substantially rectangular parallelepiped space continuous in the up-down directions. The lid portion 155 and the retainer portion 156_L penetrate the space.

Similarly, the cover mount portion 139_D, the first locking portion 114_R, the second locking portion 120_R, the third locking portion 127_R, and the cover mount portion 139_UR form a substantially rectangular parallelepiped space continuous in the up-down directions. The lid portion 155 and the retainer portion 156_R penetrate the space.

As a result, the retainer portions 156_L and 156_R engage with the first locking portions 114_L and 114_R, and the second locking portions 120_L and 120_R such that positions of the first wiring board 104 and the second wiring board 105 in the longitudinal and transverse directions do not shift. As described above, the ground plate 106 is held in the plate holding groove 147 so as not to be positionally shifted inside the first insulator 107. Therefore, it is preferred that the retainer portions 156_L and 156_R be engaged with the third locking portions 127_L and 127_R so as to penetrate in the up-down directions with a slight gap.

Thus, the retainer portions 156_L and 156_R engage with the first locking portions 114_L and 114_R, the second locking portions 120_L and 120_R, and the third locking portions 127_L and 127_R. With this structure, movement of the first wiring board 104, the second wiring board 105, and the ground plate 106 in the longitudinal direction is suppressed within a predetermined range. As a result, it is possible to prevent the first wiring board 104, the second wiring board 105, and the ground plate 106 from coming off from the first insulator 107.

The first lock mechanism portion 109 is a portion configured to switch between a locked state, in which the plug 101 cannot be removed from the receptacle 102, and a released state, in which the plug 101 can be removed, when the plug 101 is fitted to the receptacle 102. The first lock mechanism portion 109 in this embodiment is configured as a separate member from the first insulator 107, and is integrally made of, for example, metal as a material.

Specifically, the first lock mechanism portion 109 includes a flat plate portion 157, a curved portion 158, a lock portion 159, and an operation portion 160.

The flat plate portion 157 is a portion which forms a substantially rectangular flat plate, and is fitted in the slide groove portion 154 of the lock mechanism mount portion 135. The flat plate portion 157 is held under a state of being pressed to the lock mechanism mount portion 135 by, for example, interference-fit.

The curved portion 158 is a portion which is curved upward from a front end of the flat plate portion 157 and is folded back rearward. The lock portion 159 is a portion which is connected to the curved portion 158 to extend rearward, and includes a portion which protrudes upward. The operation portion 160 is a portion which further extends rearward from the lock portion 159.

In such a first lock mechanism portion 109, the lock portion 159 is positioned at a predetermined locked position when the first lock mechanism portion 109 receives no force. When the first lock mechanism portion 109 receives a force to move the lock portion 159 downward against an elastic force of mainly the curved portion 158 by, for example, an operator pushing the operation portion 160 downward, the lock portion 159 moves to a released position on a lower side.

(Configuration of Receptacle 102)

Figure 13:
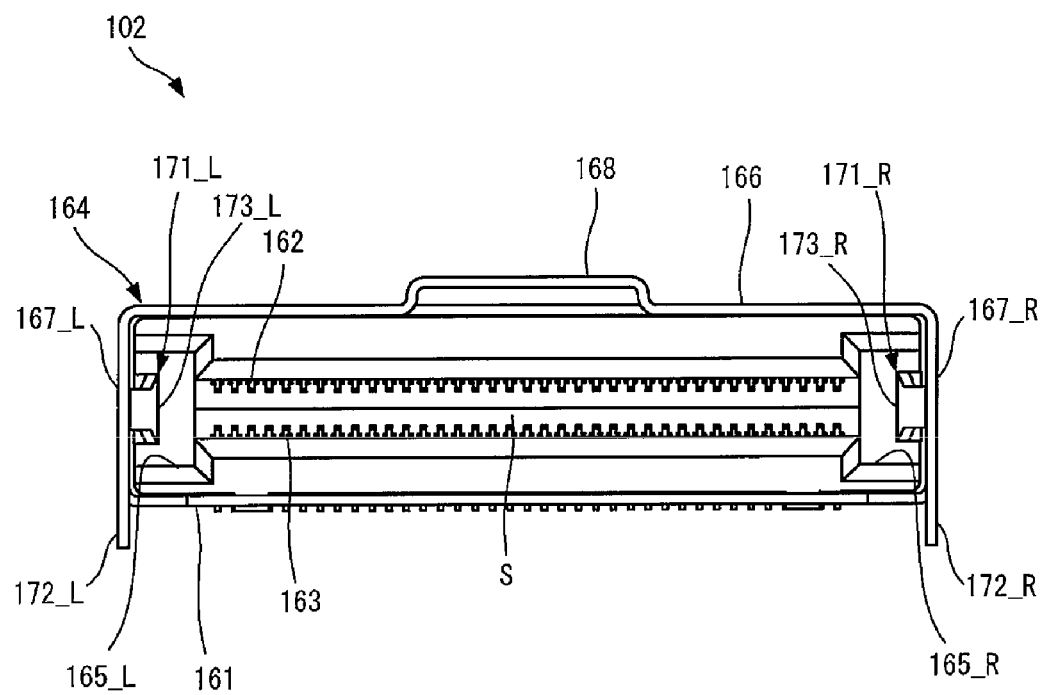
FIG. 13 is a front view of the receptacle in the embodiment.
Figure 13:
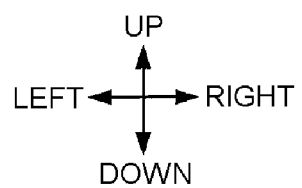

The receptacle 102 is a connector to be fitted to the plug 101. As illustrated in FIG. 1 and FIG. 13, which are a perspective view and a front view, respectively, the receptacle 102 includes a second insulator 161, a plurality of first contacts 162, a plurality of second contacts 163, and a metal shell 164.

The second insulator 161 is a member to which the plug 101 is to be fitted. The second insulator 161 is integrally made of, for example, resin as a material.

The second insulator 161 in this embodiment is a substantially rectangular parallelepiped, and has a substantially rectangular parallelepiped fitting space S inside thereof, which opens forward. The protecting portion 134 of the plug 101 and the first wiring board 104, the second wiring board 105, and the ground plate 106 accommodated in the protecting portion 134 are fitted to the fitting space S.

The second insulator 161 in this embodiment has side wall opening portions 165_L and 165_R in left and right side wall portions. The respective side wall opening portions 165_L and 165_R are portions which connect an outside of the second insulator 161 to the fitting space S inside thereof, and form openings which are open forward. That is, the respective side wall opening portions 165_L and 165_R are portions which form a space between the ground plate 106 and the metal shell 164 when the plug 101 is fitted.

The plurality of first contacts 162 are substantially linear conductors which are held in line in the transverse direction on an upper portion of an inner surface of the second insulator 161. The plurality of first contacts 162 are spring contact points which have contact points near the lowest point and can apply a downward force to the contact points by elasticity. When the receptacle 102 is fitted to the plug 101, the plurality of first contacts 162 are brought into contact with the first exposed-wiring portion 111_E at the respective contact points.

The plurality of second contacts 163 are substantially linear conductors which are held in line in the transverse direction on a lower portion of the inner surface of the second insulator 161. The plurality of second contacts 163 are spring contact points which have contact points near the highest point and can apply an upward force to the contact points by elasticity. When the receptacle 102 is fitted to the plug 101, the plurality of second contacts 163 are brought into contact with the second exposed-wiring portion 117_E at the respective contact points.

The metal shell 164 is a metal member provided in a vicinity of the second insulator 161. The metal shell 164 includes a shell upper surface portion 166 and left and right shell side surface portions 167_L and 167_R.

The shell upper surface portion 166 is a portion which has a substantially rectangular flat plate shape provided above the second insulator 161, and includes a second lock mechanism portion 168.

The second lock mechanism portion 168 is a portion having a trapezoidal shape protruding upward at a center in a rear of the shell upper surface portion 166. A space is formed between the second lock mechanism portion 168 and the second insulator 161. In the space, the lock mechanism mount portion 135 and the first lock mechanism portion 109 mounted thereto are fitted when the plug 101 is fitted.

Further, the second lock mechanism portion 168 has a lock hole portion 169 at an upper portion thereof. The lock hole portion 169 is a substantially rectangular hole which is formed to penetrate in the up-down directions in a portion having a flat plate shape at an upper portion of the second lock mechanism portion 168. The lock hole portion 169 in this embodiment is a hole formed at a position that is substantially at a center in the transverse direction in the upper portion of the second lock mechanism portion 168, and is away from a rear end by a predetermined length.

The respective left and right shell side surface portions 167_L and 167_R are portions having a substantially rectangular flat plate shape which are bent from a left end portion and a right end portion of the shell upper surface portion 166 and extend downward, and are provided at a left and a right of the second insulator 161.

The respective left and right shell side surface portions 167_L and 167_R include left and right side surface opening portions 170_L and 170_R, left and right ground metal fittings 171_L and 171_R, and left and right ground connection portions 172_L and 172_R.

The side surface opening portions 170_L and 170_R form substantially rectangular openings, which penetrate in the transverse direction, and are elongated in the longitudinal direction, in the shell side surface portions 167_L and 167_R, respectively.

The respective left and right ground metal fittings 171_L and 171_R are portions which are brought into contact with portions of the side end portions of the ground plate 106, which are exposed to an outside of the first insulator 107, when the plug 101 is fitted. The left and right ground metal fittings 171_L and 171_R are provided in a pair to face each other in the transverse direction. When the plug 101 is fitted, the left and right ground metal fittings 171_L and 171_R are positioned at respective sides of the portions (exposed-plate portions 132_L and 132_R) of the side end portions of the ground plate 106, which are exposed to the outside of the first insulator 107.

The ground metal fittings 171_L and 171_R in this embodiment are formed by plate spring contact points extending in the longitudinal direction, which have one ends fixed to the side surface opening portions 170_L and 170_R, respectively.

Specifically, the respective ground metal fittings 171_L and 171_R include second contact points 173_L and 173_R, and second elastic portions 174_L and 174_R. The ground metal fittings 171_L and 171_R are provided to pass through the side surface opening portions 170_L and 170_R in the transverse direction, respectively, such that the second contact points 173_L and 173_R are positioned in the fitting space S.

The respective second contact points 173_L and 173_R are portions to be brought into contact with the portions (exposed-plate portions 132_L and 132_R) of the side end portions of the ground plate 106, which are exposed to the outside of the first insulator 107.

The second contact point 173_L in this embodiment is a portion extending from a free end, which corresponds to another end of the ground metal fitting 171_L, to have a predetermined length, and is curved to protrude rightward. The second contact point 173_L is brought into contact with the left end portion of the ground plate 106, which is exposed to the outside of the first insulator 107, mainly in the vicinity of the leftmost point.

The second contact point 173_R is a portion extending from a free end, which corresponds to another end of the ground metal fitting 171_R, to have a predetermined length, and is curved to protrude leftward. The second contact point 173_R is brought into contact with the right end portion of the ground plate 106, which is exposed to the outside of the first insulator 107, mainly in the vicinity of the rightmost point.

The second elastic portions 174_L and 174_R are portions having elasticity which apply rightward and leftward forces to the second contact points 173_L and 173_R, respectively. The second elastic portions 174_L and 174_R in this embodiment are elongated portions which are connected to the side surface opening portions 170_L and 170_R and extend in the front direction to be connected to the second contact points 173_L and 173_R, respectively.

As described above, such ground metal fittings 171_L and 171_R are provided in a pair so as to face each other in the transverse direction. Accordingly, when the plug 101 is fitted, the ground metal fittings 171_L and 171_R sandwich the ground plate 106 from the sides to be brought into contact with the ground plate 106.

The left and right ground connection portions 172_L and 172_R are small protrusions protruding downward from lower ends of the left and right shell side surface portions 167_L and 167_R, respectively. The number of the left and right ground connection portions 172_L and 172_R in this embodiment is two for each of the left and right shell side surface portions 167_L and 167_R, but one, three, or more ground connection portions may be provided. The respective ground connection portions 172_L and 172_R are fixed to a ground wiring of an object by soldering, for example.

So far, the configurations of the connector assembly 100 according to this embodiment and the plug 101 and the receptacle 102, which form the connector assembly 100, have been described. In the following, an example of a method of manufacturing the plug 101 and the receptacle 102 is described. (Method of manufacturing plug 101)

In order to manufacture the plug 101, the first wiring board 104, the second wiring board 105, the ground plate 106, the first insulator 107, the cover 108, and the first lock mechanism portion 109 are prepared.

In the preparation of the first wiring board 104, for example, the plurality of first signal wirings 111 are sandwiched from above and below by thin resin films, and those films are mutually fixed by adhesion or welding, for example. A metal foil is adhered to one main surface of the mutually fixed films so that the first ground conductor 112 is provided. Then, a portion of the film in the vicinity of the front end is removed, and hence the first exposed-wiring portion 111_E is formed. As a result, the first wiring board 104 can be easily manufactured and prepared. The second wiring board 105 can also be manufactured by the same method as the first wiring board 104 and prepared.

The ground plate 106 is, for example, a metal plate which has been cut out into a predetermined shape. The ground plate 106 has long holes, in which a pair of elongated and substantially rectangular small pieces are connected in the respective hole portions 126, and the pair of third locking portions 127_L and 127_R. Then, each small piece connected to the respective long hole portions 126 is bent in a shape corresponding to the elastic contact point portions 123_L and 123_R. As a result, the ground plate 106 including the elastic contact point portions 123_L and 123_R, which have one ends fixed to the long hole portions 126, can be easily manufactured and prepared.

The respective first insulator 107 and the cover 108 may be manufactured and prepared by, for example, resin molding.

The first lock mechanism portion 109 may be manufactured and prepared by, for example, bending a metal plate that has been cut out into a predetermined shape by an appropriate method.

The ground plate 106 is inserted from the rear of the first insulator 107 along the plate guide groove portions 140_L and 140_R. On this occasion, the pair of protruding portions 124 is brought into contact with the plate guide groove portions 140_L and 140_R, with the result that the ground plate 106 is inserted under a state of receiving a force from the first insulator 107. Thus, when a predetermined length is press-fitted, the ground plate 106 is held in the first insulator 107 under a pressed state.

Then, the first wiring board 104 and the second wiring board 105 are inserted on upper and lower sides of the ground plate 106 from the rear of the first insulator 107. The first wiring board 104 and the second wiring board 105 are pushed in until the respective distal ends are brought into contact with the distal end protecting portion 145. On this occasion, the first wiring board 104 and the second wiring board 105 are held under a state of being pressed toward the upper wall portion 133_U and the lower wall portion 133_D by the elastic contact point portions 123_L and 123_R, respectively.

The cover 108 is press-fitted from the lower side of the first insulator 107 to be fitted to the cover mount portions 139_UL, 139_UR, and 139_D. As a result, the retainer portions 156_L and 156_R penetrate inside the first insulator 107 in the up-down directions so that the first wiring board 104, the second wiring board 105, and the ground plate 106 are prevented from coming off from the first insulator 107. Therefore, it is possible to easily manufacture the plug 101 having a configuration in which the first wiring board 104, the second wiring board 105, and the ground plate 106 are hardly come off from the first insulator 107.

Next, the flat plate portion 157 of the first lock mechanism portion 109 is press-fitted to the slide groove portion 154 from the front. As a result, the first lock mechanism portion 109 is held by the lock mechanism mount portion 135 under a pressed state, and the plug 101 in this embodiment is completed.

Thus, according to this embodiment, the plug 101 can be easily assembled and manufactured.

(Method of Manufacturing Receptacle 102)

In order to manufacture the receptacle 102, the second insulator 161, the plurality of first contacts 162, the plurality of second contacts 163, and the metal shell 164 are separately prepared.

The second insulator 161 may be, for example, manufactured by resin molding to be prepared. The respective first contacts 162 and the respective second contacts 163 may be manufactured by bending substantially linear elongated metal bars into a predetermined shape to be prepared.

In order to manufacture the metal shell 164, a flat metal plate having a predetermined shape is prepared. The flat metal plate is provided with a notch in the transverse direction at a position for forming the second lock mechanism portion 168 spaced rearward from a center of a front end by a predetermined length. Then, the lock hole portion 169 is formed at a predetermined position in front of the notch, and a front portion in front of the notch is curved upward to form the second lock mechanism portion 168.

Further, in the flat metal plate, holes are formed at a position away from a left end portion by a predetermined length in the right direction and at a position away from a right end portion by a predetermined length in the left direction. In the holes, elongated rectangular pieces extending forward are connected to the side surface opening portions 170_L and 170_R. The rectangular pieces connected to the respective side surface opening portions 170_L and 170_R are bent into a shape corresponding to the elastic contact point portions 123_L and 123_R. As a result, elastic contact point portions 123_L and 123_R having one ends fixed to the side surface opening portions 170_L and 170_R, respectively, are formed.

Then, the linear portions as bent portions, which extend to have a predetermined length in the longitudinal direction at positions away from the respective left end portion and the right end portion, are bent substantially orthogonally, with the result that portions corresponding to the left and right shell side surface portions 167_L and 167_R are formed. As a result, the second insulator 161 including the elastic contact point portions 123_L and 123_R fixed to the respective side surface opening portions 170_L and 170_R of the shell side surface portions 167_L and 167_R can be easily manufactured and prepared.

The plurality of first contacts 162 and the plurality of second contacts 163 are press-fitted to, for example, the groove formed in the second insulator 161 to be mounted to the second insulator 161. The metal shell 164 is fitted to the second insulator 161 from the front such that the elastic contact point portions 123_L and 123_R are accommodated in the respective side wall opening portions 165_L and 165_R of the second insulator 161. On this occasion, the metal shell 164 may be fixed by fitting of appropriate portions or the like so as not to come off from the second insulator 161.

With this process, the receptacle 102 is completed. Thus, according to this embodiment, the receptacle 102 can be easily assembled and manufactured.

(Way to use Plug 101 and Receptacle 102)

The receptacle 102 is fixed by soldering the ground connection portions 172_L and 172_R to the ground wiring of a substrate or other such object, for example. Then, the plurality of first contacts 162 and the plurality of second contacts 163 are fixed to the signal wirings provided in the object by soldering or the like.

Further, the plurality of first signal wirings 111 and the plurality of second signal wirings 117 of the plug 101 are connected by soldering or the like to the signal wirings of the object to which the plug 101 is mounted.

The plug 101 is fitted from the rear of the receptacle 102 such that the protecting portion 134 is accommodated in the fitting space S. On this occasion, when the plug 101 is pushed forward with respect to the receptacle 102, the first lock mechanism portion 109 is brought into contact with the second lock mechanism portion 168, and the lock portion 159 moves downward from the locked position, which is an initial position.

When the plug 101 is further pushed forward with respect to the receptacle 102 until the lock portion 159 reaches the lock hole portion 169, the lock portion 159 is fitted to the lock hole portion 169 mainly by the elastic force of the curved portion 158 (locked state). As a result, the plug 101 and the receptacle 102 are fitted and fixed to each other so as not to come off from each other. On this occasion, the plurality of respective first signal wirings 111 and the plurality of first contacts 162 are connected to each other, and the plurality of respective second signal wirings 117 and the plurality of second contacts 163 are connected to each other.

In this case, the exposed-plate portions 132_L and 132_R are brought into contact with the second contact points 173_L and 173_R while the plug 101 is being fitted to the receptacle 102, to push and expand the second contact points 173_L and 173_R rightward and leftward respectively.

Thus, the second elastic portions 174_L and 174_R apply forces to the second contact points 173_L and 173_R to come into contact with the exposed-plate portions 132_L and 132_R, respectively. When the plug 101 is further moved forward with respect to the receptacle 102, the ground plate 106 moves forward under a state in which the exposed-plate portions 132_L and 132_R receive forces to be sandwiched from the left and the right to be in contact by the second contact points 173_L and 173_R.

Figure 14:
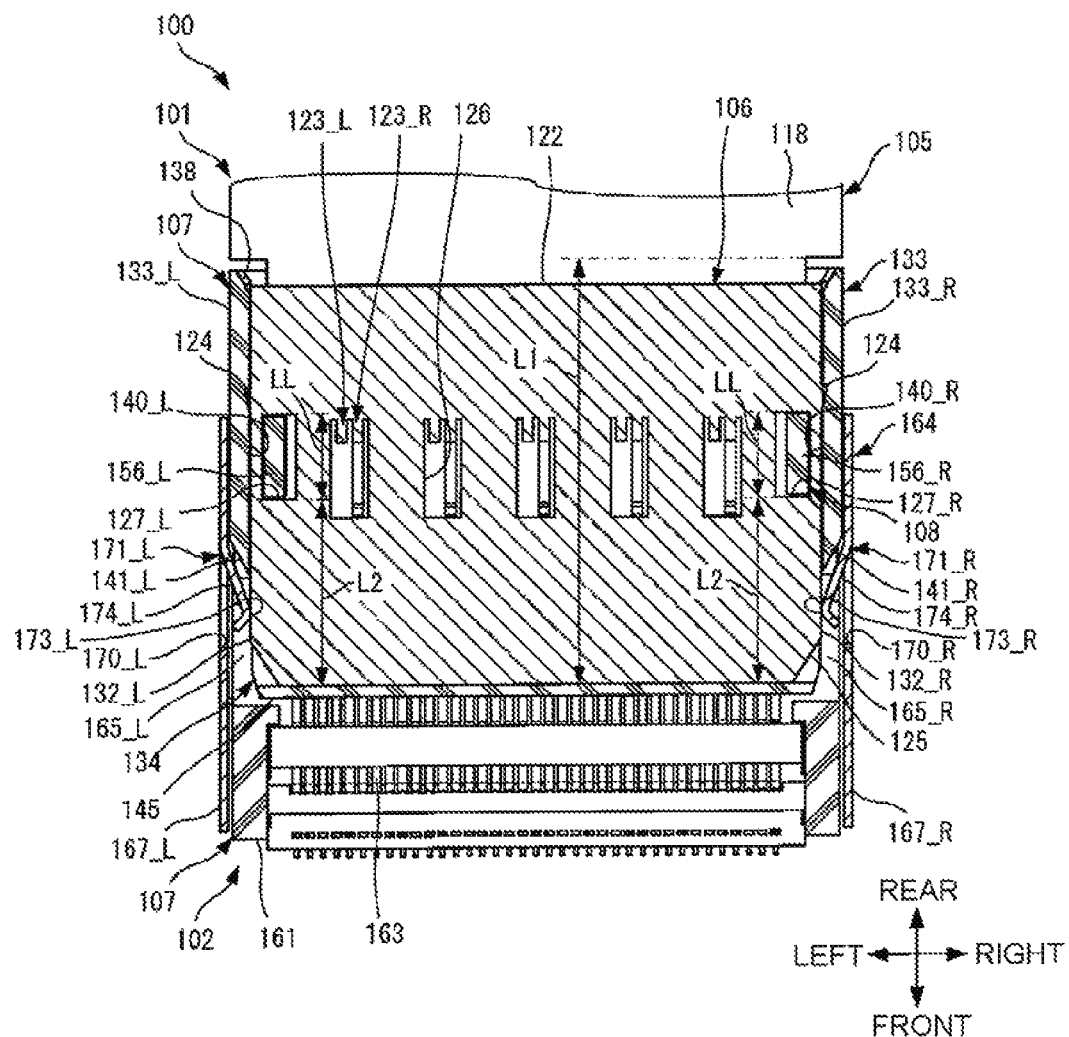
FIG. 14 is a top view of a cross-section including a center in up-down directions of a slide groove in a state in which the plug and the receptacle in the embodiment are fitted to each other.

As a result, as illustrated in FIG. 14, which is a sectional view, under the state in which the plug 101 and the receptacle 102 are fitted to each other, the pair of ground metal fittings 171_L and 171_R are caused to sandwich to be brought into contact with the exposed-plate portions 132_L and 132_R from the sides, respectively. As a result, the first ground conductor 112 and the second ground conductor 118 can be connected to the ground wiring via the metal shell 164 and the ground plate 106.

Thus, the first ground conductor 112 and the second ground conductor 118 can be reliably and easily connected to the ground wiring by the elastic force and by the plug 101 pushed into the receptacle 102 from the rear.

Next, when the plug 101 is removed from the receptacle 102, the operation unit 160 may be pulled out rearward under a state of being pushed downward.

That is, when the operation portion 160 is pushed downward mainly against the elastic force of the curved portion 158, the lock portion 159 moves to the released position on the lower side of the lock hole portion 169. As a result, the fixation between the plug 101 and the receptacle 102 due to the fitting between the lock portion 159 and the lock hole portion 169 is released (released state).

Thus, the plug 101 is moved rearward from the receptacle 102 under the released state, in which the lock portion 159 is being pressed down, and hence the plug 101 can be removed from the receptacle 102.

In the plug 101 and the receptacle 102 in this embodiment, the plug 101 and the receptacle 102 can be easily locked under a fitted state to each other. Further, the lock can be easily released so that the plug 101 and the receptacle 102 can be removed from each other.

(Operation/Effect by this Embodiment)

According to this embodiment, the plate-shaped ground plate 106 is provided between the first wiring board 104 and the second wiring board 105, and is brought into contact with the respective first ground conductor 112 and the second ground conductor 118 by the first contact points thereof.

Then, the first insulator 107 covers at least the portion of both the entire side end portions of the first wiring board 104, the second wiring board 105, and the ground plate 106, and the two main surface portions 104_U and 105_D facing outward. As a result, the first wiring board 104, the second wiring board 105, and the ground plate 106 can be held in the first insulator 107. Further, the ground plate 106 is shared by the first wiring board 104 and the second wiring board 105 as a ground member.

Therefore, the plug 101 can be made more compact than in a case of providing ground members corresponding to the respective first wiring board 104 and the second wiring board 105, with the result that a large number of wirings can be connected in a compact manner.

Further, according to this embodiment, the distal end protecting portion 145 of the first insulator 107 covers at least portions of the entire distal end portions of the first wiring board 104, the second wiring board 105, and the ground plate 106. As a result, as described above, the vicinities of the distal ends of the first protruding portion 143_A and the second protruding portion 144_A are reinforced so that it is possible to reduce a fear that the plug 101 is damaged due to breakage of those protruding portions 143_A and 144_A. Therefore, the plug 101 having sufficient strength can be provided even when the plug 101 is compact.

Still further, according to this embodiment, the ground plate 106 is held in the first insulator 107 under a state of being directly pressed by the plate guide groove portions 140_L and 140_R. As a result, the plug 101, which connects the first ground conductor 112 and the second ground conductor 118 to the common ground plate 106, can be easily assembled and manufactured.

Yet further, according to this embodiment, the exposed-plate portions 132_L and 132_R are exposed to the outside of the first insulator 107. As a result, when the plug 101 is fitted to the receptacle 102, the ground plate 106 can easily be connected to members (ground metal fittings 171_L and 171_R in this embodiment) configured to set the ground plate 106 to a ground potential.

Yet further, according to this embodiment, the main body portion 133 configured to hold the ground plate 106 under the pressed state and the protecting portion 134 are included. The protecting portion 134 has the width smaller than that of the main body portion 133, to thereby expose the portions of both side end portions of the ground plate 106 to the outside.

As a result, the main body portion 133 can hold the ground plate 106 assembled by press-fitting into the first insulator 107 under the state in which the ground plate 106 is being pressed against the first insulator 107. Further, only through pressing (press-fitting) of the ground plate 106 into the first insulator 107, the exposed-plate portions 132_L and 132_R can be exposed to the outside from the protecting portion 134.

Therefore, the configuration of the plug 101 can be simplified and made compact, and such a plug 101 can be easily assembled.

In this embodiment, the protecting portion 134 is narrower than the main portion 133 in width to expose the exposed-plate portions 132_L and 132_R of the ground plate 106. In general, when a width of a portion corresponding to the protecting portion 134 is made narrow, strength of the portion is decreased as compared to a case in which the width of the portion is equal to or more than the width of the main portion 133, and mechanical strength accordingly decreases as well.

In this embodiment, the accommodation space 136 is formed to cover at least portions of the five portions including the front end portions (distal end portions), both the right and left end side portions, and the two main surface portions 104_U and 105_D, which face outward, of a whole of the first wiring board 104, the second wiring board 105, and the ground plate 106. With such a structure, the mechanical strength of the main body portion 133 can be maintained even when the width of the protecting portion 134 is made narrow to expose the exposed-plate portions 132_L and 132_R of the ground plate 106.

In addition, according to this embodiment, the protecting portion 134 includes the distal end protecting portion 145 configured to block at least a part of the plate holding groove 147 and the outside of the first insulator 107. The protecting portion 134 includes the distal end protecting portion 145, and hence the protecting portion 134 is reinforced by the distal end protecting portion 145 even when the width of the protecting portion 134 is made narrow, with the result that a decrease in strength of the protecting portion 134 can be suppressed. Therefore, the plug 101 can be prevented from being damaged, and the plug 101, which has sufficient strength even when the plug 101 is compact, can be provided.

In the above, this embodiment of this invention has been described, but this invention is not limited thereto, and may be modified as follows.

Modification Example 1

Figure 4:
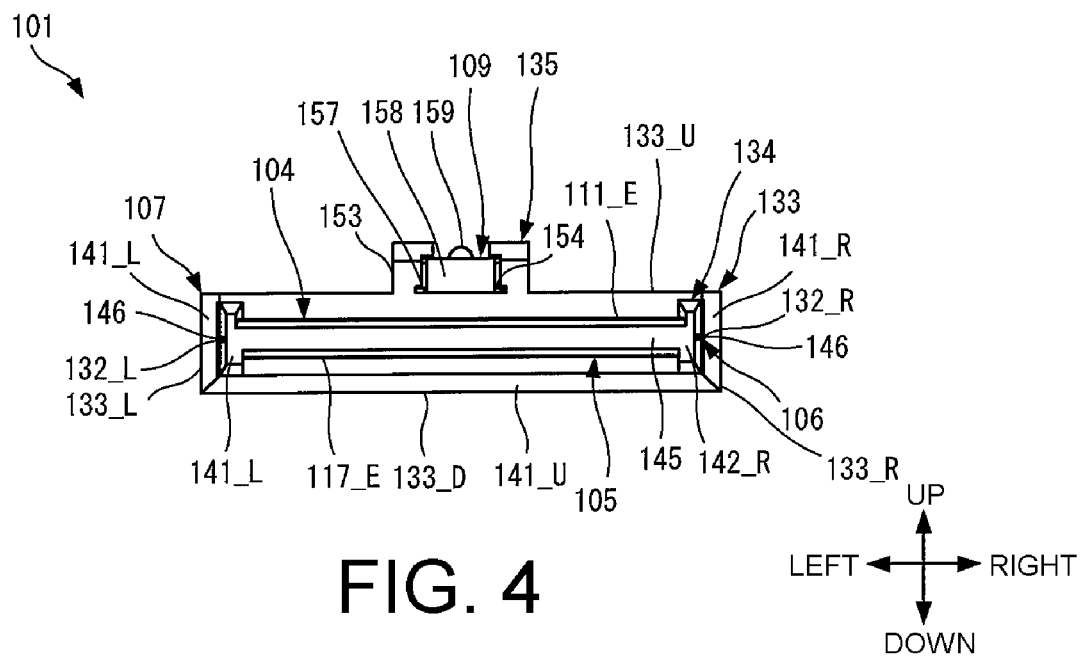
FIG. 4 is a front view of the plug in the embodiment.
Figure 5:
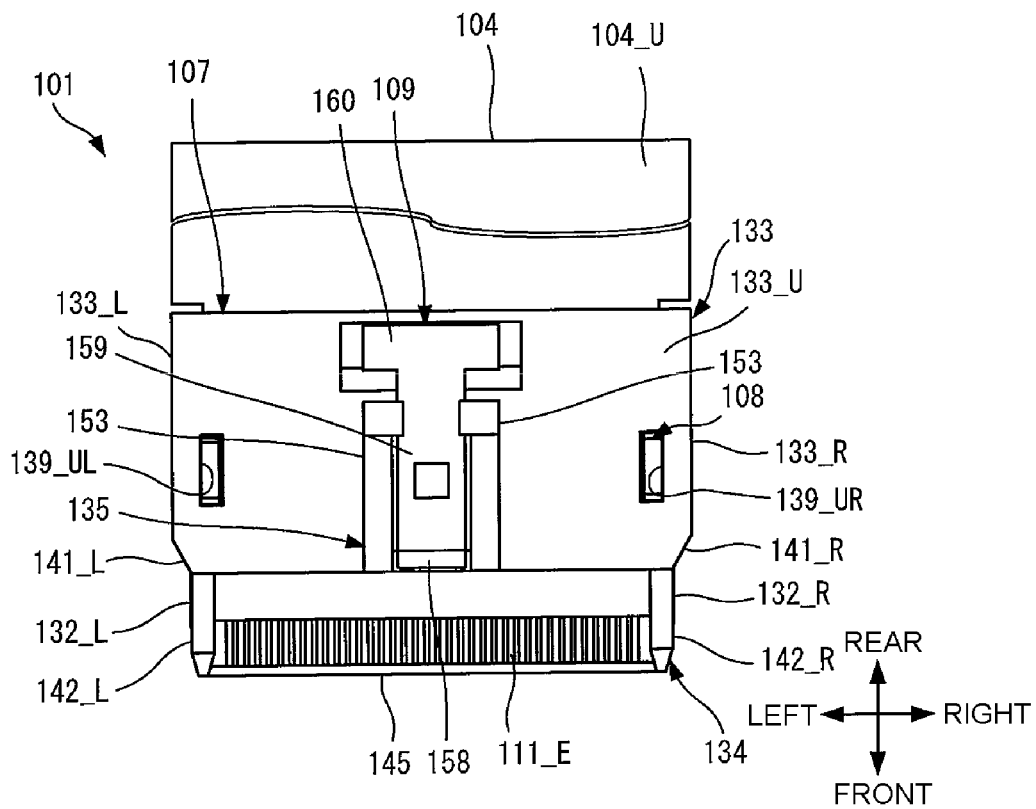
FIG. 5 is a plan view of the plug in the embodiment.
Figure 6:
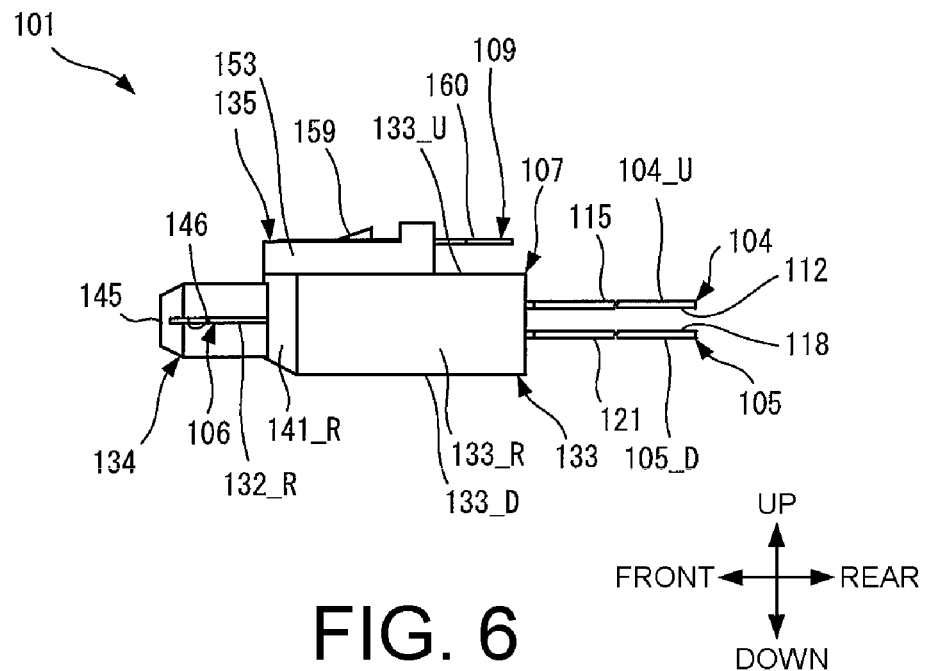
FIG. 6 is a right side view of the plug in the embodiment.
Figure 7:
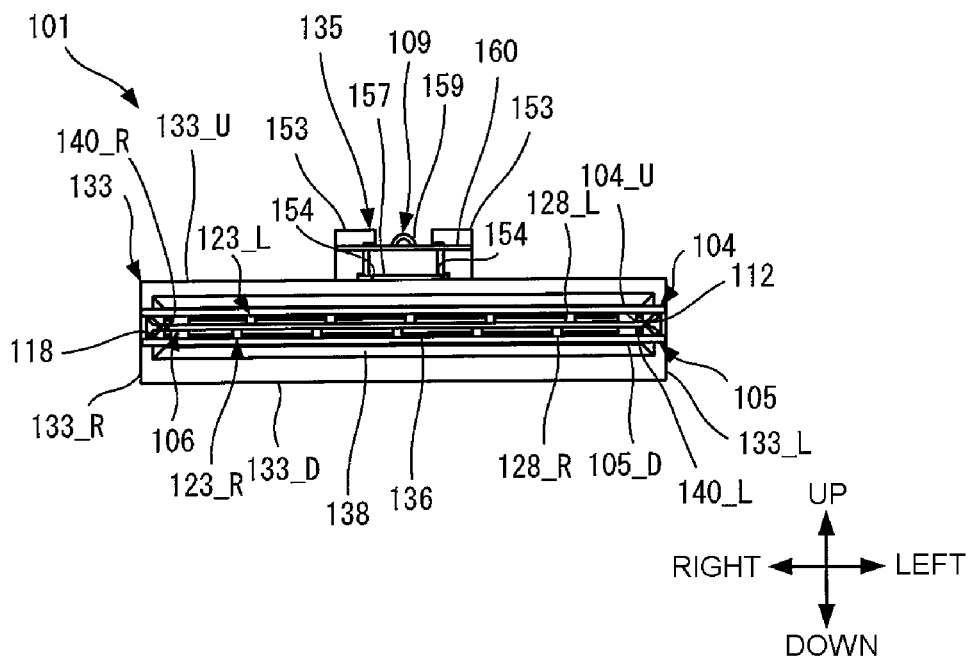
FIG. 7 is a rear view of the plug in the embodiment.

In the above-mentioned embodiment, as illustrated in FIG. 4 and the like, the exposed-plate portions 132_L and 132_R exposed from the protecting portion 134 are relatively small. For example, the width of the protecting portion 134 may become further narrower such that the exposed-plate portions 132_L and 132_R become larger.

On this occasion, the protected portion 125 may be deformed such that the end portions of the exposed-plate portions 132_L and 132_R may be bent upward, downward, or in other appropriate direction. As a result, a size of portions at which the ground metal fittings 171_L and 171_R and the exposed-plate portions 132_L and 132_R come into contact with each other can be further increased.

Modification Example 2

In the above-mentioned embodiment, the example has been described, in which the protected portion 125 of the ground plate 106 has a substantially rectangular flat plate shape having substantially the same width as that of the rear thereof. However, the protected portion may have elastic pieces having elasticity, which protrude to at least one of the left and right, and portions of or entire elastic pieces may be exposed-plate portions.

Figure 15:
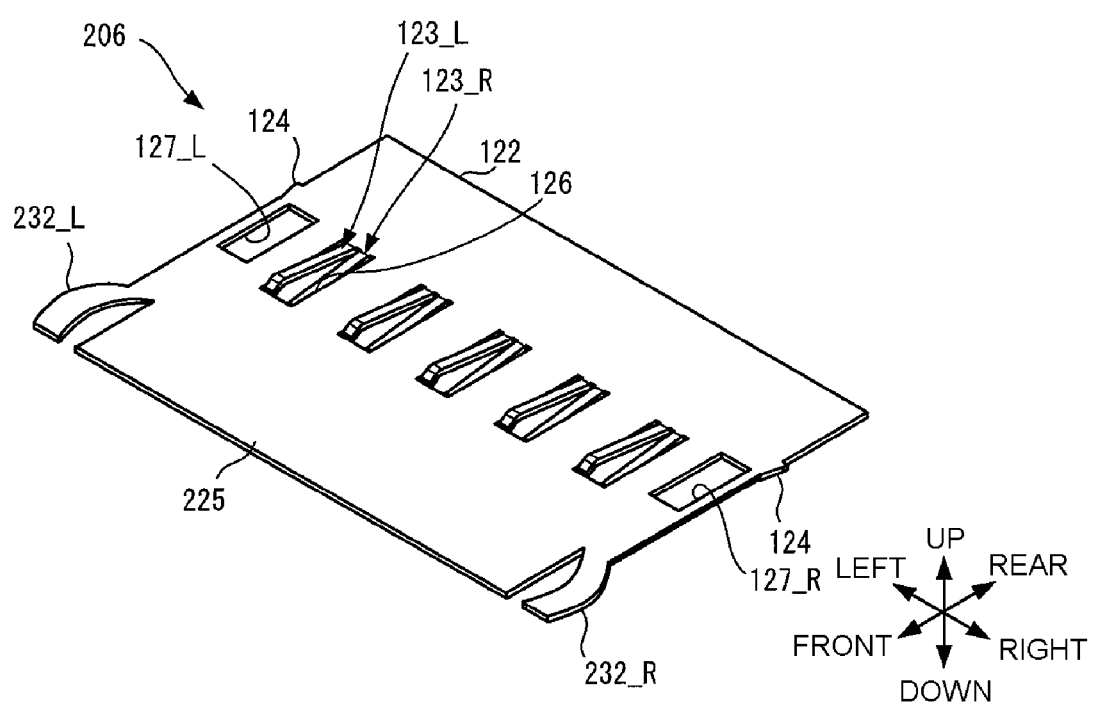
FIG. 15 is a perspective view of a ground plate in Modification Example 2 of this invention.

Specifically, for example, as illustrated in FIG. 15, which is a perspective view, the ground plate 206 in Modification Example 2 of this invention includes a protected portion 225, instead of the protected portion 125 in the above-mentioned embodiment. The ground plate 206 is formed in the same manner as in the ground plate 106 in at the above-mentioned embodiment except for the protected portion 225.

The protected portion 225 in Modification Example 2 includes exposed-plate portions 232_L and 232_R, which protrude leftward and rightward, respectively, at the left and right side end portions. The exposed-plate portions 232_L and 232_R are integrally formed with the ground plate 206, and are elastic pieces having elasticity.

Such exposed-plate portions 232_L and 232_R are curved inward when mounted to the first insulator 107. When positioned in the protecting portion 134, the exposed-plate portions 232_L and 232_R protrude outward by the elasticity thereof as illustrated in FIG. 15 to be exposed to the outside from protecting portion 134. Therefore, the ground plate 206 can also be mounted to the first insulator 107 by press-fitting similarly to the ground plate 106 in the above-mentioned embodiment.

The same effect as that of the above-mentioned embodiment can also be obtained by Modification Example 2.

Modification Example 3

In the above-mentioned embodiment, the example has been described in which the distal end protecting portion 145 is continuously connected over the substantially entire width in the transverse direction at the front ends of the first protruding portion 143_A and the second protruding portion 144_A. However, a through hole, which forms a space to connect the plate holding groove 147 to the outside of the first insulator in the longitudinal direction, may be formed in the distal end protecting portion.

Figure 16:
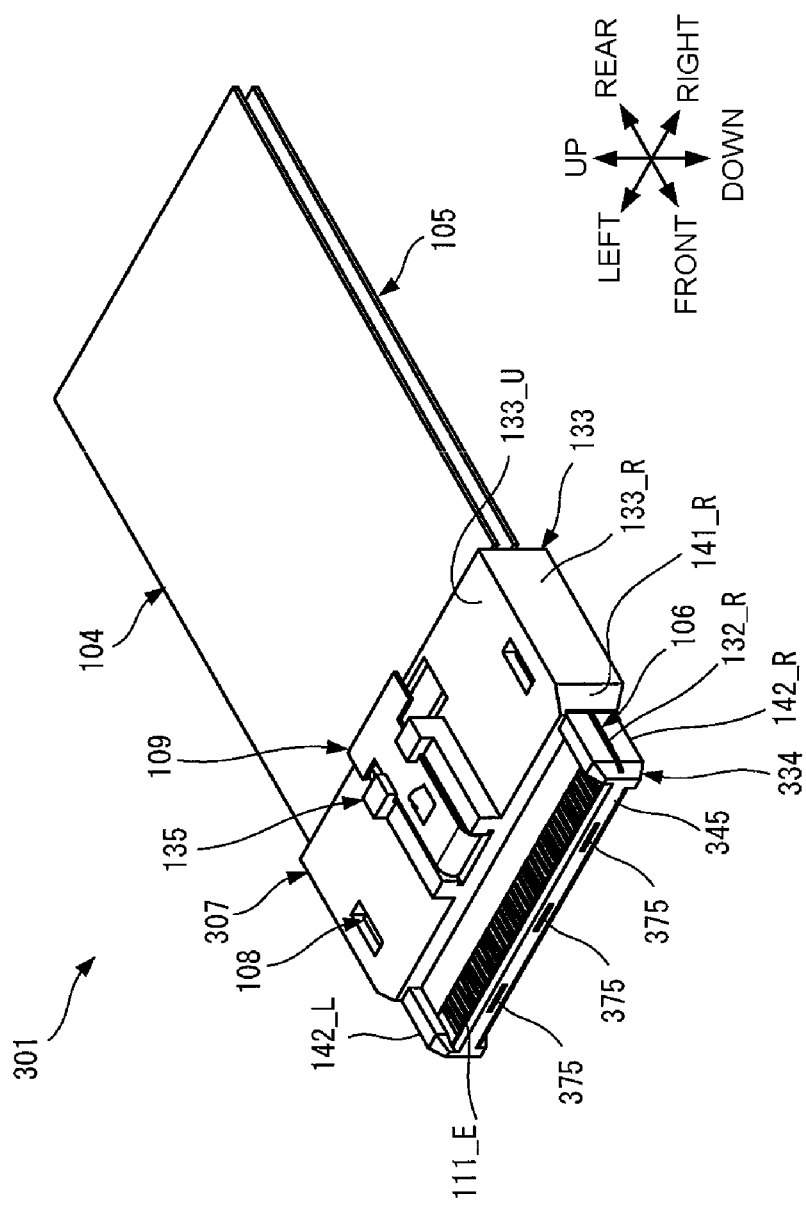
FIG. 16 is a perspective view of a plug in Modification Example 3 of this invention.
Figure 17:
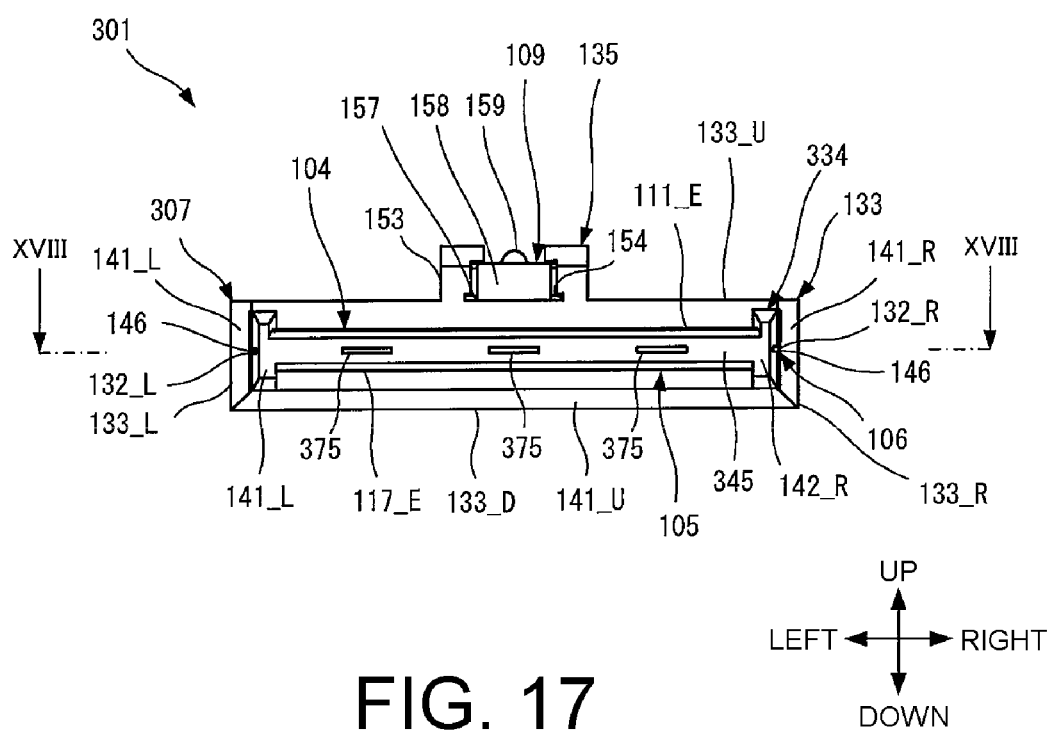
FIG. 17 is a front view of the plug in Modification Example 3.
Figure 18:
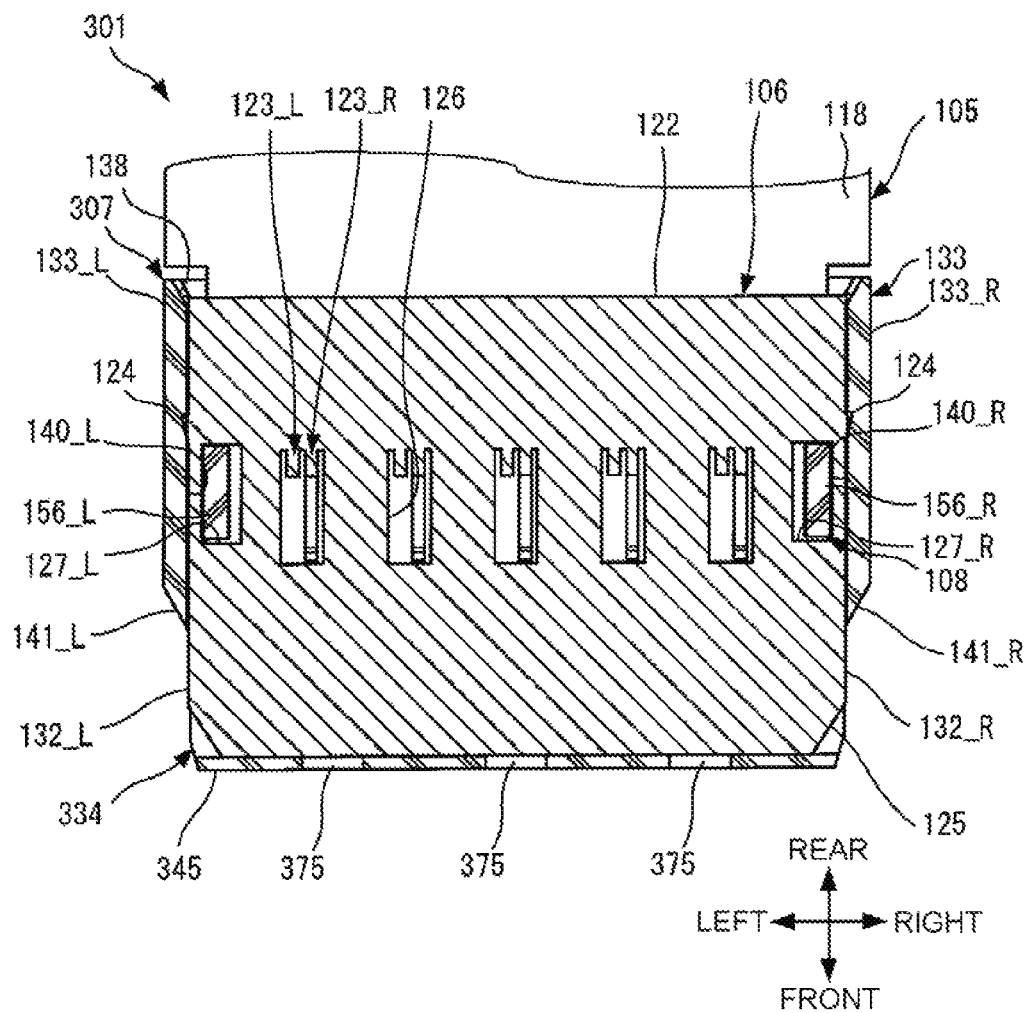
FIG. 18 is a sectional view taken along the line XVIII-XVIII of FIG. 17.

As illustrated in FIG. 16, which is a perspective view, FIG. 17, which is a front view, and FIG. 18, which is a sectional view, a plug 301 in Modification Example 3 of this invention includes a first insulator 307 instead of the first insulator 107. Other portions may be formed in the same manner as in the plug 101 in the above-mentioned embodiment.

The first insulator 307 includes a protecting portion 334 instead of the protecting portion 134 in the above-mentioned embodiment, and other portions may be formed in the same manner as in the first insulator 107 in the above-mentioned embodiment. The protecting portion 334 includes a distal end protecting portion 345 instead of the distal end protecting portion 145, and other portions may be formed in the same manner as in the protecting portion 134 in the above-mentioned embodiment.

The distal end protecting portion 345 in Modification Example 3 is a portion having a substantially rectangular flat plate shape, which is elongated in the transverse direction, and has three through hole portions 375. The respective three through hole portions 375 form through holes connecting the plate holding groove 147 to the outside of the first insulator 307 in the longitudinal direction. Note that, the number of through hole portions 375 is not limited thereto, and may be one, two, four, or more.

According to Modification Example 3, a rear surface of the distal end protecting portion 345 is intermittently connected over the substantially entire width in the transverse direction at the front ends of the first protruding portion 143_A and the second protruding portion 144_A. Further, in that case, the distal end protecting portion 345 can reinforce the vicinities of the first protruding portion 143_A and the second protruding portion 144_A in the same manner as in the distal end protecting portion 145 in the above-mentioned embodiment.

As described in the above-mentioned embodiment, it is therefore possible to reduce the fear that the plug 101 is damaged mainly due to the breakage of the first protruding portion 143_A and the second protruding portion 144_A. Accordingly, as in the above-mentioned embodiment, the plug 101 having sufficient strength even when the plug 101 is compact can be provided.

Further, the distal end protecting portion 345 have such through hole portions 375, and hence the first insulator 307 can be easily molded. As a result, a fear that distortion or error during molding can be liable to occur is reduced, and hence a shape thereof can be stabilized.

Modification Example 4

In the above-mentioned embodiment, the example has been described in which the protecting portion 134 protrudes substantially straight forward from the main body portion 133 with the width narrower than that of the main body portion 133. However, a portion of at least one side end portion of the ground plate may be exposed to the outside the first insulator.

Figure 19:
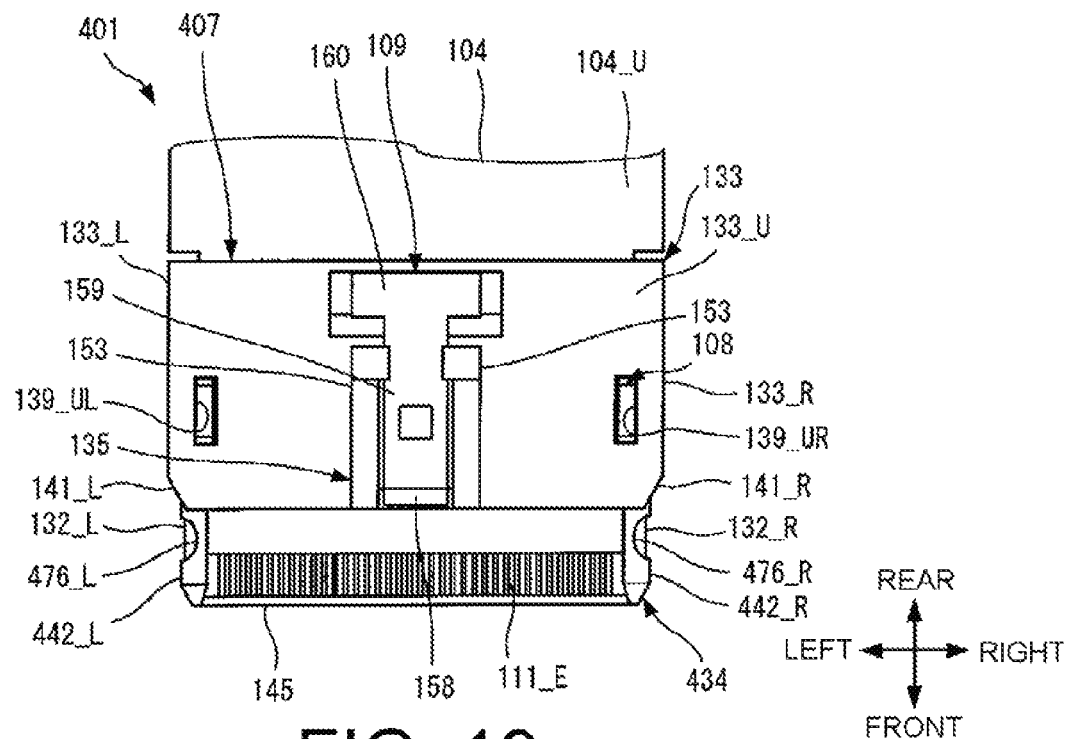
FIG. 19 is a plan view of a plug in Modification Example 4 of this invention.

Specifically, for example, as illustrated in FIG. 19, which is a plan view, a plug 401 in Modification Example 4 of this invention includes a first insulator 407, instead of the first insulator 107 in the above-mentioned embodiment. Other portions may be formed in the same manner as in the plug 101 according to the above-mentioned embodiment.

The first insulator 407 in Modification Example 4 includes a protecting portion 434 instead of the protecting portion 134 in the above-mentioned embodiment, and other portions are formed in the same manner as in the first insulator 107 in the above-mentioned embodiment. The protecting portion 434 includes left and right side wall portions 442_L and 442_R instead of the left and right side wall portions 142_L and 142_R in the above-mentioned embodiment. Other portions are formed in the same manner as in the protecting portion 134 of the above-mentioned embodiment.

The left and right side wall portions 442_L and 442_R in Modification Example 4 have inward curved portions 476_L and 476_R, respectively, protruding inward from portions away from distal ends by a predetermined distance to the rear. That is, the inward curved portion 476_L formed at a left end portion of the protecting portion 434 is curved to protrude rightward. The inward curved portion 476_R formed at a right end portion of the protecting portion 434 is curved to protrude leftward. Except for those portions, the side wall portions 442_L and 442_R are formed in the same manner as in the side wall portions 142_L and 142_R in the above-mentioned embodiment.

Modification Example 4 is different from the above-mentioned embodiment in that the vicinities of the distal end portions of the left end portion and the right end portion of the protected portion 125 of the ground plate 106 are not exposed. However, portions of both the side end portions of the protected portion 125 can be exposed to the outside from the protecting portion 434. Therefore, the same effect as that of the above-mentioned embodiment can also be obtained by Modification Example 4.

Modification Example 5

Further, for example, although not shown, only a portion of one side end portion of the ground plate 106 may be exposed to the outside of the first insulator 107.

Modification Example 6

In the above-mentioned embodiment, the example in which the first insulator 107 is integrally formed is described. However, the first insulator 107 may be formed in a combination of a plurality of members.

Specifically, for example, the first insulator 107 may be formed by two members divided into an upper member and a lower member, which are engaged with each other by protruding claws or the like, and are fixed with bolts, nuts, screws, or the like.

On this occasion, the plate guide groove portions 140_L and 140_R may not be formed. The ground plate 106 may be held by the first insulator 107 under a state in which the ground plate 106 is indirectly applied with forces in the up-down directions from the upper and lower members forming the first insulator 107 via the first wiring board 104 and the second wiring board 105.

Further, with this structure, the plug 101, which connects the first ground conductor 112 and the second ground conductor 118 to the common ground plate 106, can be easily assembled and manufactured.

Modification Example 7

In the above-mentioned embodiment, the example in which the ground metal fittings 171_L and 171_R are integrally provided in the metal shell 164 and mounted to the second insulator 161 has been described. However, the ground metal fittings 171_L and 171_R may not be mounted to the second insulator 161 as long as the ground metal fittings 171_L and 171_R are provided in association with the second insulator 161.

Specifically, for example, individual members corresponding to the respective left and right shell side surface portions 167_L and 167_R may be mounted to the substrate 103 common to the second insulator 161, to which the plurality of first contacts 162 and the plurality of second contacts 163 are mounted.

On this occasion, each member corresponding to the shell side surface portions 167_L and 167_R may be mounted to the substrate 103 with respect to the second insulator 161 in the same positional relationship as the shell side surface portions 167_L and 167_R in the above-mentioned embodiment. The structure also provides the same effect as that of the above-mentioned embodiment.

Modification Example 8

In the above-mentioned embodiment, the example in which the ground metal fittings 171_L and 171_R are formed by the plate spring contact points which sandwich the protected portion 125 from the left and right has been described, but this invention is not limited thereto.

For example, the respective ground metal fittings 171_L and 171_R may be flat plate-shaped portions bent from the left and right side wall portions 142_L and 142_R such that the end surfaces protrude toward the right and left.

On this occasion, the ground metal fittings 171_L and 171_R may protrude with such a length as to come into contact with the exposed-plate portions 132_L and 132_R. While the plug 101 and the receptacle 102 are fitted to each other, the ground metal fittings 171_L and 171_R and the exposed-plate portions 132_L and 132_R move in contact with each other respectively, by the end surfaces thereof. This structure also provides the same effect as that of the above-mentioned embodiment.

Modification Example 9

In the above-mentioned embodiment, the example in which the ground plate 106 is brought into contact with the first ground conductor 112 and the second ground conductor 118 via the first contact points 128_L and 128_R provided in the pair of elastic contact point portions 123_L and 123_R, respectively, has been described.

However, the ground plate may include first contact points, which are brought into contact with the respective first ground conductor 112 and the second ground conductor 118.

Figure 20:
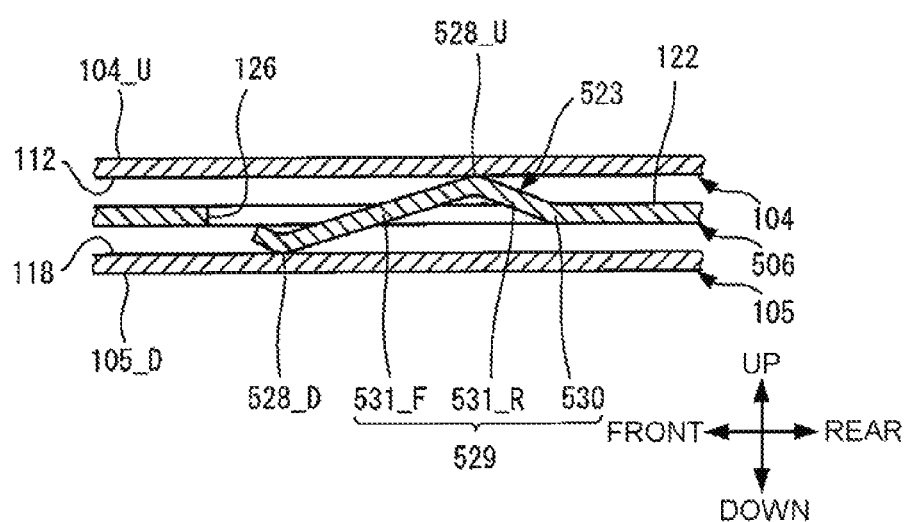
FIG. 20 is a side sectional view of a ground plate in Modification Example 9 of this invention.
Figure 21:
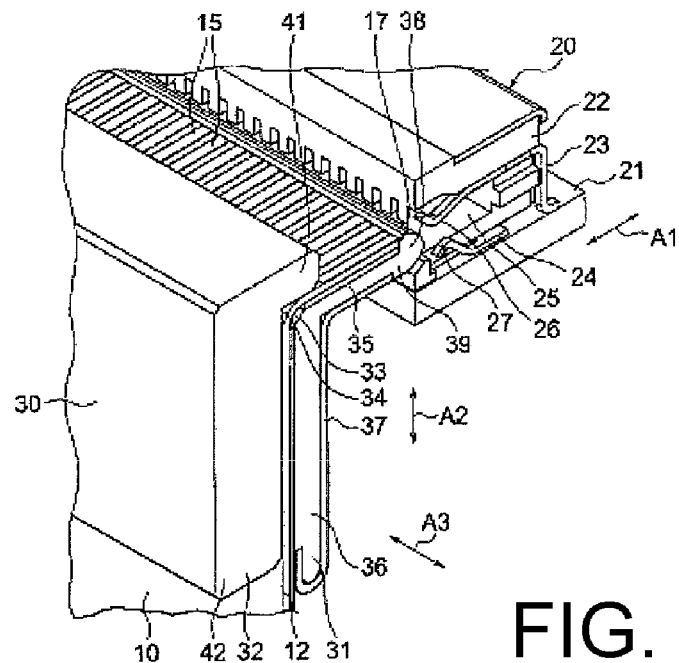
FIG. 21 is an enlarged sectional perspective view for illustrating a state in which a connector set, which includes a plug and a receptacle in a related art, is being connected.
Figure 22:
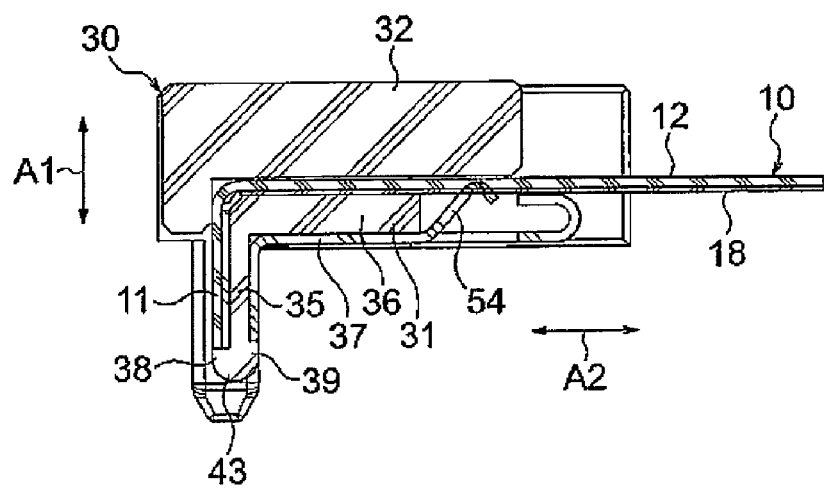
FIG. 22 is a sectional view of the plug in the related art.

For example, as illustrated in FIG. 20, which is a side sectional view, a ground plate 506 in Modification Example 9 of this invention includes an elastic contact point portion 523 associated with the long hole portion 126 of the main plate portion 122 as in the above-mentioned embodiment. The elastic contact point portion 523 in Modification Example 9 is a plate spring contact point having two first contact points 528_U and 528_D protruding upward and downward, respectively.

Specifically, the elastic contact point portion 523 includes the first contact points 528_U and 528_D and a first elastic portion 529. The first contact points 528_U and 528_D come into contact with the first ground conductor 112 and the second ground conductor 118, respectively. The first elastic portion 529 has elasticity to apply forces toward the first ground conductor 112 and the second ground conductor 118 to the respective first contact points 528_U and 528_D.

The first elastic portion 529 includes a base end portion 530 connected to the main plate portion 122, and plate-shaped portions 531_F and 531_R. The plate-shaped portion 531_R is an elongated plate-shaped portion extending from the base end portion 530 to the first contact point 528_U to connect therebetween. The plate-shaped portion 531_F is an elongated plate-shaped portion extending forward from the first contact point 528_U to the second contact point 528_D to connected therebetween. In Modification Example 9, the first contact points 528_U and 528_D are also positioned closer to the front end portion (distal end portion) of the ground plate 506 than the base end portion 530, as in the above-mentioned embodiment.

With such an elastic contact point portion 523, as in the above-mentioned embodiment, the first contact point 528_U and the first contact point 528_D can come into contact, by the elastic force thereof in a pressed state, with the first ground conductor 112 and the second ground conductor 118, respectively. One or more elastic contact point portions 523 in Modification Example 9 may be provided in the ground plate 506, with the result that both the first ground conductor 112 and the second ground conductor 118 can be set to the ground potential.

In the above, one exemplary embodiment and modification examples of this invention are described. However, this invention is not limited to the embodiment and the modification examples. For example, this invention may include a mode in which the embodiment and the modification examples described above are partially or entirely combined in a suitable manner or a mode suitably changed from the mode of combination.

What is claimed is:

1. A connector, comprising:
   a first flexible wiring board including a first signal wiring and a first ground conductor;
   a second flexible wiring board including a second signal wiring and a second ground conductor;
   a plate-shaped ground plate, which is provided between the first flexible wiring board and the second flexible wiring board, and includes first contact portions which are brought into contact with each of the first ground conductor and the second ground conductor; and
   a first insulator forming an accommodation space for holding the first flexible wiring board, the second flexible wiring board, and the ground plate,
   wherein the first insulator forms the accommodation space so as to cover at least a part of each of five portions including distal end portions, both side end portions, and two main surface portions, which face outward, of a whole of the first flexible wiring board, the second flexible wiring board, and the ground plate, and holds the ground plate under a pressing state,
   wherein a portion of each of the first signal wiring and the second signal wiring is exposed to an outside of the first insulator, and
   wherein a portion of at least one side end portion of the ground plate is exposed to the outside of the first insulator.

2. The connector according to claim 1, wherein the first insulator includes:
   a main body portion configured to hold the ground plate under a pressing state; and
   a protecting portion having a width narrower than a width of the main body portion so as to expose the portion of the at least one side end portion of the ground plate to the outside.

3. The connector according to claim 2, wherein the protecting portion includes:
   a plate holding groove, into which a protected portion including the distal end portion of the ground plate is to be fitted inside; and
   a distal end protecting portion configured to block at least a part of the plate holding groove and the outside of the first insulator.

4. The connector according to claim 3, wherein the distal end protecting portion includes a through hole for connecting the plate holding groove and the outside of the first insulator.

5. The connector according to claim 1, wherein the ground plate further includes a first elastic portion configured to apply, by having elasticity, a force toward one of the first ground conductor and the second ground conductor to at least one of the first contact portions.

6. The connector according to claim 5,
   wherein the ground plate further includes a flat plate-shaped main plate portion,
   wherein the first elastic portion includes a base end portion, which is connected to the main plate portion to be bent or curved, and a plate-shaped portion extending from the base end portion to be connected to the at least one of the first contact portions, and
   wherein the at least one of the first contact portions is positioned closer to the distal end portion of the ground plate than the base end portion.

7. The connector according to claim 1,
   wherein the first flexible wiring board, the second flexible wiring board, the ground plate, and the first insulator includes a first locking portion, a second locking portion, a third locking portion, and a fitting retainer portion respectively, which are aligned in one direction to form a space when the first flexible wiring board, the second flexible wiring board, and the ground plate are held in the first insulator, and
   wherein the connector further includes a retainer member, which is fixed to the fitting retainer portion and penetrates the first locking portion, the second locking portion, and the third locking portion, which are aligned in the one direction.

8. The connector according to claim 1,
   wherein the first flexible wiring board further includes a third ground conductor configured on a main surface different from a main surface on which the first ground conductor is configured, and
   wherein the second flexible wiring board further includes a fourth ground conductor configured on a main surface different from a main surface on which the second ground conductor is configured.

9. A connector assembly, comprising:
   the connector according to claim 1; and
   a mating connector to be fitted to the connector;
   the mating connector including:
   a first contact to be brought into contact with the first signal wiring; a second contact to be brought into contact with the second signal wiring;
   a ground metal fitting to be brought into contact with a portion of the at least one side end portion of the ground plate exposed to the outside of the first insulator of the ground plate; and
   a second insulator configured to hold the first contact and the second contact.

10. The connector assembly of claim 9, wherein the ground metal fitting includes:
    a second contact point to be brought into contact with a portion of the at least one side end portion of the ground plate; and
    a second elastic portion configured to apply, by having elasticity, a force toward the portion of the at least one side end portion of the ground plate to the second contact point.

11. The connector assembly according to claim 9,
    wherein the mating connector further includes a metal shell provided in a vicinity of the second insulator,
    wherein the metal shell includes a flat plate-shaped shell side surface portion provided in correspondence to the side surface of the second insulator,
    wherein the ground metal fitting includes a plate spring contact, and
    wherein the shell side surface portion includes a shell opening portion, to which one end of the ground metal fitting is to be fixed.

12. The connector assembly according to claim 9,
    wherein portions of both side end portions of the ground plate are exposed to the outside of the first insulator,
    wherein the ground metal fitting is provided in a pair on each side of the portions of both of the exposed side end portions of the ground plate, and
    wherein the pair of ground metal fittings is configured to sandwich, from sides, the portions of both of the exposed side end portions of the ground plate to be brought into contact with the portions.

* * * * *

UNITED STATES PATENT AND TRADEMARK OFFICE
CERTIFICATE OF CORRECTION

PATENT NO. : 10,897,098 B2  
APPLICATION NO. : 16/527456  
DATED : January 19, 2021  
INVENTOR(S) : Yuki Suda and Yukitaka Tanaka Page 1 of 1

It is certified that error appears in the above-identified patent and that said Letters Patent is hereby corrected as shown below:

On the Title Page

On page 2, item (56), under References Cited, FOREIGN PATENT DOCUMENTS, please change:
"KR 1999-00662007 A 8/1999"
To correctly read:
--KR 1999-0068207 A 8/1999--;

In the Specification

In Column 8, Line 20, please change:
"up-down directions direction"
To correctly read:
--up-down direction--;

In Column 11, Line 39, please change:
"133 _D"
To correctly read:
--133_D--.

Signed and Sealed this  
Ninth Day of March, 2021

Drew Hirshfeld  
*Performing the Functions and Duties of the*  
*Under Secretary of Commerce for Intellectual Property and*  
*Director of the United States Patent and Trademark Office*